(12) United States Patent
Zhou et al.

(10) Patent No.: US 9,274,320 B2
(45) Date of Patent: Mar. 1, 2016

(54) MEMS-BASED ZOOM LENS SYSTEM

(71) Applicant: NATIONAL UNIVERSITY OF SINGAPORE, Singapore (SG)

(72) Inventors: Guangya Zhou, Singapore (SG); Hongbin Yu, Singapore (SG); Fook Siong Chau, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 14/246,571

(22) PCT Filed: Oct. 5, 2012

(86) PCT No.: PCT/SG2012/000374
§ 371 (c)(1),
(2) Date: Apr. 7, 2014

(87) PCT Pub. No.: WO2013/052014
PCT Pub. Date: Apr. 11, 2013

(65) Prior Publication Data
US 2014/0354856 A1 Dec. 4, 2014

Related U.S. Application Data

(60) Provisional application No. 61/544,275, filed on Oct. 7, 2011.

(51) Int. Cl.
*G02B 15/14* (2006.01)
*G02B 13/00* (2006.01)
(Continued)

(52) U.S. Cl.
CPC ............... *G02B 13/009* (2013.01); *B81B 5/00* (2013.01); *G02B 7/09* (2013.01); *G02B 7/102* (2013.01);
(Continued)

(58) Field of Classification Search
CPC .... G02B 13/009; G02B 13/0075; G03B 5/02; B81B 5/00
See application file for complete search history.

(56) References Cited

U.S. PATENT DOCUMENTS 3,507,565 A     4/1970  Alvarez et al.
4,925,281 A  *  5/1990  Baker ........................... 359/676
(Continued)

FOREIGN PATENT DOCUMENTS

GB          1099026        1/1968
WO   WO 2007/037691 A2 *  4/2007  ............... G02B 3/00
WO       WO2008064859       6/2008

OTHER PUBLICATIONS

Rege, S et al; "Application of the Alvarez-Humphrey concept to the design of a miniaturized scanning microscope"; Opt. Express, vol. 12 No. 12, p. 2574-2588 (Jun. 14, 2004) p. 2583-2584, Figure 7.
Schwiegerling J et al; "Minimal Movement Zoom Lens"; Appl. Opt. vol. 48 No. 10, p. 1932-1935 (2009); p. 1932, Frigures 2 & 3.
Barbero, S; "The Alvarez and Lohmann Refractive Lenses Revisited"; Opt. Express vol. 17 No. 11, p. 9376-9376-9390 (2009).

*Primary Examiner* — Joseph P Martinez
(74) *Attorney, Agent, or Firm* — James E. Eakin

(57) ABSTRACT

The present application provides a micromechanical (MEMS) based zoom lens system, for use in miniature device applications, such as miniature electronic imaging devices. The MEMS-based zoom lens system comprises at least four optical elements, or two Alvarez or Lohmann lenses, that are configured for passage of optical signals therethrough along an optical signal path. Each optical element is MEMS-driven and displaceable in a direction substantially transverse to the optical signal path. In use, the transverse displacement of the optical elements vary an overall focal length of the MEMS zoom lens system such as to provide an optical zoom function. A method of manufacturing a MEMS zoom lens system is also provided in a further aspect.

48 Claims, 14 Drawing Sheets

(51) Int. Cl.
*G03B 5/02* (2006.01)
*G02B 7/10* (2006.01)
*G02B 26/08* (2006.01)
*B81B 5/00* (2006.01)
*G02B 15/00* (2006.01)
*G02B 7/09* (2006.01)
*H04N 5/232* (2006.01)

(52) U.S. Cl.
CPC ........ *G02B 13/0065* (2013.01); *G02B 13/0075* (2013.01); *G02B 15/00* (2013.01); *G02B 26/0833* (2013.01); *G03B 5/02* (2013.01); *H04N 5/23296* (2013.01); *G03B 2205/0046* (2013.01); *G03B 2205/0084* (2013.01); *Y10T 29/4978* (2015.01); *Y10T 29/49826* (2015.01)

(56) References Cited

U.S. PATENT DOCUMENTS

| | | |
|---|---|---|
| 5,067,802 A | 11/1991 | Orino |
| 5,392,159 A | 2/1995 | Sasaki et al. |
| 6,137,958 A | 10/2000 | Toyoda |
| 7,149,307 B2 | 12/2006 | Puharinen et al. |
| 7,446,946 B2 | 11/2008 | Yoshida et al. |
| 2004/0218246 A1 | 11/2004 | Onuki et al. |
| 2008/0192326 A1 | 8/2008 | Mizumaki et al. |
| 2008/0199177 A1 | 8/2008 | Ide |
| 2010/0061073 A1 | 3/2010 | Oldsen et al. |

* cited by examiner

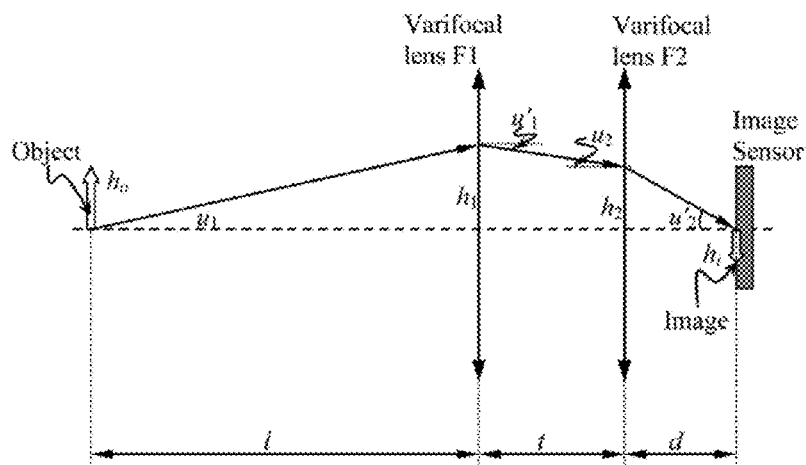
FIG. 1
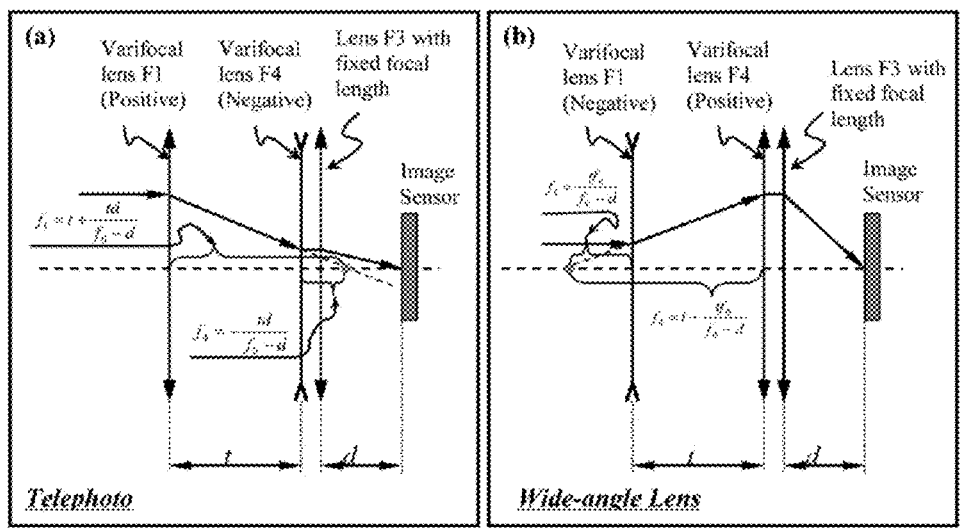
FIG. 2A  FIG. 2B

405

406

MEMS-BASED ZOOM LENS SYSTEM

RELATED APPLICATION

This application is related to, and claims the benefit of, International Application PCT/SG2012/000374, filed 5 Oct. 2012, which is incorporated herein by reference as though set forth in full, as well as being attached hereto as Appendix A.

TECHNICAL FIELD

The present application relates generally to zoom lens systems, apparatuses, devices, and structures. More particularly, embodiments of the present application relate to a microelectromechanical (MEMS) based miniature zoom lens system or apparatus. Further, embodiments of the present application are directed to electronic imaging devices including a MEMS based zoom lens system.

BACKGROUND

With the rapid and continuous development of science and technology, ever increasing numbers of new technologies as well as associated products in various fields have been successfully presented in commercial markets, largely enhancing/facilitating human daily life and improving living quality. In the area of communications, the mobile or cellular telephone provides one example of such technology. Before its invention, people had to remain close to stationary telephones to avoid missing important calls. With the invention of cell phones, such a problem was easily solved. Users can stay in contact at any time no matter where they are or what they are doing, typically without inducing much interference in daily activities.

More recently, with the increasing standard of human living and increasing technological capabilities, cell phones that provide only simple audio functions no longer meet market demands or requirements. Additional functional devices or modules have been gradually developed and have subsequently evolved, making cell phones more and more versatile and intelligent. A miniature camera is one such module, by way of which video communication and image/video capture functions can be implemented. Due to their excellent portability and powerful functionality, present-day smart phones are very popular and have become one of the most indispensable devices in daily life. Today, nearly two billion mobile phones have digital cameras, and an additional 800 million smart phone cameras are shipped each year. Besides the aforementioned smart phones, miniaturized cameras also find wide-spread applications in various civilian and military fields, including endoscopes for healthcare, security cameras, and surveillance cameras for unmanned aerial vehicles (UAVs) and micro aerial vehicles (MAVs). Given this extremely large market perspective, miniature cameras have garnered much interest from researchers from academia to industries, all over the world.

Many efforts have been taken to improve the performances of miniaturized digital cameras so as to make their operation closer to that of traditional digital cameras. In the early stages of miniature digital camera development, the associated optical system was intentionally designed to possess a long depth of focus. Such an optical system could simultaneously provide clear images of nearly all objects in the field of view without requiring an auto-focusing function. This treatment largely simplified system configuration, but such simplification occurred at the expense of lower image contrast as well as reduced or suboptimal image quality. Although better image and video quality has been realized though increasing pixel numbers and improving corresponding hardware and software associated with image processing, more sophisticated functions such as autofocus and zoom are still in great demand and await technological breakthroughs.

Unlike their traditional counterparts, miniaturized digital cameras must meet dimensional requirements associated with limited or very limited available space. Hence, conventional autofocus and zoom mechanisms are not appropriate for miniaturized digital cameras due to the bulky volume of such mechanisms. Implementation of these functionalities in miniature digital cameras thus poses a challenging technical problem.

SUMMARY

The disclosed embodiments relate to devices, systems and methods for providing successful, reliable, and robust realization of optical zooming functionalities in real miniaturized devices. In accordance with an aspect of the present application, a zoom lens system includes at least one micromechanical (MEMS) actuator configured to displace or drive one or more optical elements; and at least four MEMS-driven optical elements, each of the at least four MEMS-driven optical elements configured for passage of optical signals therethrough along an optical signal travel path, each of the at least four MEMS-driven optical elements including at least one free-form surface, the at least four MEMS-driven optical elements positioned in a pair-wise configuration such that a first and a second MEMS-driven optical elements form a first pair of optical elements and a third and a fourth MEMS-driven optical elements form a second pair of optical elements, each of the at least four MEMS-driven optical elements displaceable in a direction substantially transverse to the optical signal travel path to allow a change in optical power of one or both of the first and second pair of optical elements.

In accordance with a further embodiment of the application, the at least four MEMS-driven optical elements comprises a set of varifocal lenses, for instance, a first varifocal lens and a second varifocal lens. The first varifocal lens can be associated with or correspond to a first lens element and a second lens element of the at least four MEMS-driven optical elements; and the second varifocal lens can be associated with or correspond to a third lens element and a fourth lens element of the at least four MEMS-driven optical elements. In various embodiments, the first pair of optical elements correspond to or are generally analogous or analogous to, or pairwise configured as, an Alvarez lens or a Lohmann lens; and the second pair of optical elements correspond to or are generally analogous or analogous to or pairwise configured as, an Alvarez lens or a Lohmann lens in an adjunctive, counterpart, corollary, or corresponding manner to the configuration of the first lens element and the second lens element. In an embodiment, one or both of the first and the second pair of optical elements comprise a corresponding varifocal lens that is configured to operate as one of an Alvarez or Alvarez type lens and a Lohmann or Lohmann type lens. In another embodiment, one or both of the first and the second pair of optical elements comprise a corresponding varifocal lens, and wherein the varifocal lens includes surfaces that are correlated in accordance with a higher-than-third-order polynomial.

The at least four MEMS-driven optical elements are configured to provide the MEMS zoom lens system with each of optical zooming and autofocus functionality. Optical zooming functionality is realized through combined tuning of a first focal length of a first varifocal lens and a second focal length of a second varifocal lens, and autofocus functionality is realized through adjustment of the first focal length of the first varifocal lens independent of the second varifocal lens. Particular embodiments of the present application can achieve an optical magnification of at least approximately 2×. The at least four MEMS-driven optical elements can include an initial lens element or optical surface (e.g. upon which light can be incident) and a final lens element or optical surface (e.g., from which light can exit) that are separated by a distance of less than approximately 30 mm, for instance, about 20 mm.

Some embodiments of the present application include an aperture (e.g., a variable aperture) configured to limit an amount of light traveling through the at least four MEMS-driven optical elements. For instance, particular embodiments include a variable aperture disposed adjacent or proximate to a first MEMS-driven optical element of the at least four MEMS-driven optical elements, such that the aperture can limit an amount of light entering the first MEMS-driven optical element.

Embodiments of the present application can also include a set of adjunctive or auxiliary optical elements, where such additional optical elements are and are configured for providing additional optical power or correcting aberration(s). The set of additional optical elements can include one or more spherical, aspherical, or freeform surfaces depending upon embodiment details. In an embodiment, the set of additional optical components are substantially fixed in position substantially transverse to the optical signal travel path.

In addition or as an alternative to the foregoing, embodiments of the present application can include or incorporate optical element structural and/or material property modifications or variations (e.g., surface or thickness profile modifications) corresponding to the first and/or second varifocal lenses for aberration reduction, minimization, or correction purposes. For instance, a set of aberration correction functions $f_i(x,y)$ can be mapped onto or incorporated into the thickness profiles of particular initially or originally defined Alvarez lens or Lohmann lens freeform surfaces associated with the at least four MEMS-drive optical elements. As a result, one or more varifocal lenses corresponding to the at least four MEMS-driven optical elements can exhibit essentially freeform, substantially freeform, or quasi-freeform surfaces in a manner that facilitates aberration correction.

In accordance with an additional embodiment of the present application, a MEMS zoom lens system includes a first displacement apparatus configured for displacing the first MEMS-driven optical element or a first lens element relative to the second MEMS-driven optical element or a second lens element in a direction substantially transverse to the optical signal travel path or optical axis. A displacement apparatus can include a lens element carrier (e.g., a platform structure) that is freely or generally freely suspended relative to a displacement or translation axis that is substantially transverse to the optical axis. For instance, the lens element carrier can be coupled to a suspension apparatus or structure (e.g., a set of flexure suspensions) configured for elastic deformation along such a displacement or translation axis. In particular embodiments, the displacement apparatus includes at least one reference support structure; a first platform configured to carry the first lens element; a first flexure suspension coupled between the first platform and the at least one reference support structure; a second platform configured to carry the second lens element; and a second flexure suspension coupled between the second platform and the at least one reference support structure. Each of the first flexure suspension and the second flexure suspension is configured for elastic deformation along a direction substantially transverse to the optical signal travel path.

The displacement apparatus can further include a set of drive mechanisms configured to convey or transmit a displacement force to a lens element such that the lens element can be displaced in a direction substantially transverse to the lens element's optical axis. For instance, the set of drive mechanisms can include least one MEMS actuator configured to transmit a displacement force to a platform configured to carry a lens element. The set of drive mechanisms can further include a displacement amplification mechanism (e.g., a set of flexure beams) coupled between the platform and a MEMS actuator.

In an embodiment of the present application, one or more of the at least four MEMS-driven optical elements includes a set of orientation indicators to allow alignment of the one or more of the at least four MEMS-driven optical elements within the zoom lens system.

In another aspect of the application, a process for providing an optical zoom is provided, including providing at least four micromechanical (MEMS)-driven optical elements, each of the at least four MEMS-driven optical elements configured for passage of optical signals therethrough along an optical signal travel path, each of the at least four MEMS-driven optical elements having at least one free-form surface, and positioning the at least four MEMS-driven optical elements in a pair-wise configuration such that a first and a second MEMS-driven optical elements form a first pair of optical elements and a third and a fourth MEMS-driven optical elements form a second pair of optical elements, wherein activating at least one MEMS actuator displaces one or more of the at least four MEMS-driven optical elements in a direction substantially transverse to the optical signal travel path to allow a change in optical power of one or both of the first and second pair of optical elements.

The first pair of optical elements includes a first varifocal lens and the second pair of optical elements includes a second varifocal lens. Displacing the first lens element relative to the second lens element changes a first focal length of the first varifocal lens. Overall focal length of the MEMS can be manipulated by simultaneously varying the first and/or the second focal lengths, such that the resultant image of an object is sharpened by only moving the lens elements in the zoom system.

In an embodiment, the first focal length is changed, while a second focal length of the second verifocal lens is held constant. This provides the MEMS zoom lens system with an autofocus function. In another embodiment, an optical zoom functionality is provided through combined tuning of the first focal length of the first varifocal lens and the second focal length of the second varifocal lens. At least one of the MEMS-driven optical elements can be displaced with a drive mechanism including at least one MEMS actuator. Further, the actuation of the MEMS actuator may be amplified with a displacement amplification mechanism, for example, a set of flexure beams.

To reduce optical aberrations in the MEMS zoom lens system, any of an auxiliary optical element and an optical element modification function may be provided and placed in the optical signal travel path. Such auxiliary elements may be fixed in position and/or shape. Further, optical element modification functions, such as optical element structural and/or material property modifications or variations, by way of aberration correction functions may be incorporated into thickness profiles of the optical elements. In another embodiment, the amount of light traveling through the MEMS zoom lens system is limited with a variable aperture.

In a further embodiment of the application, the process further includes aligning the at least four MEMS-driven optical elements using a set of orientation indicators, wherein the set of orientation indicators correspond to at least one reference axis of the freeform surface of one or more of the MEMS-driven optical elements, the at least one reference axis is transverse to a thickness profile variation axis of the freeform surface, and the aligning comprises providing a set of alignment structures carried by a movable microstructure assembly, and spatially aligning the one or more of the MEMS-driven optical elements and the movable microstructure assembly by aligning the set of orientation indicators relative to the set of alignment structures.

In accordance with an aspect of the application, a process for manufacturing or fabricating a MEMS zoom lens system comprises fabricating a first movable microstructure assembly as an integrated unit; providing a lens element having a freeform surface; and establishing an alignment of the freeform surface relative to the movable microstructure assembly. The integrated movable microstructure assembly can include a generally planar platform configured for carrying a lens element such that an optical axis of the lens element is substantially perpendicular to the first and second surfaces; a reference support structure; a flexure suspension coupled between the platform and the reference support structure, and configured for elastic deformation along a direction transverse to the optical axis; and a displacement mechanism (e.g., which includes a microactuator, and which can further include a displacement amplification mechanism) configured to apply a displacement force to the platform in a direction transverse to the optical axis.

The movable microstructure assembly can be fabricated by way of an SOI micromachining process. In certain embodiments, the movable microstructure assembly and a lens element carried thereby are collectively fabricated as an integrated unit. In some embodiments, the movable microstructure assembly and the lens element are fabricated as separate units, after which the movable microstructure assembly and the lens element are coupled or joined. A process in accordance with a further aspect of the application can include providing a set of orientation indicators corresponding to at least one axis of a freeform surface of a lens element; providing a set of alignment structures (e.g., a diffraction grating and/or other structural elements) carried by the movable microstructure assembly; and spatially aligning the first lens element and the movable microstructure assembly by aligning the lens element's orientation indicator(s) relative to the movable microstructure assembly's alignment structure(s).

Further, in an embodiment, a set of varifocal lens is assembled by pairing the first movable microstructure assembly with an aligned first lens element having a freeform surface with a substantially similar second movable microstructure assembly with an aligned second lens element having a freeform surface. In this pairing, the freeform surface of the first lens element corresponds to the freeform surface of the second lens element. In such a way, the focal length of the varifocal lens is changed by moving the first lens element and the second lens element relative to each other.

Another embodiment provides fabricating a lens element having a freeform surface with a replication molding process. The replication molding process may comprise using a master mold with the desired freeform surface, and this master mold is fabricated by way of single-point diamond turning technology. The lens element to be produced may be made up of an ultra-violet light curable adhesive.

In a further aspect of the application, an electronic imaging device is provided. Such an electronic device includes an optical window having a cross sectional area transverse to an optical axis, the optical window configured to allow propagation of optical signals to the electronic device along the optical axis, a micromechanical (MEMS) zoom lens system configured to receive optical signals propagating through the optical window along the optical axis, the MEMS zoom lens system comprising at least four MEMS-driven optical elements, each of the at least four MEMS-driven optical elements including at least one free-form surface, the at least four MEMS-driven optical elements positioned in a pair-wise configuration such that a first and a second MEMS-driven optical elements form a first pair of optical elements and a third and a fourth MEMS-driven optical elements form a second pair of optical elements, each of the at least four MEMS-driven optical elements displaceable in a direction substantially transverse to the optical signal travel path to allow a change in optical power of one or both of the first and second pair of optical elements. The electronic device further includes an image sensor configured to receive optical signals propagating through the MEMS zoom lens system along the optical axis.

In an embodiment, the electronic device includes or is a personal digital assistant, a mobile telephone, a tablet computer, a mobile telephone-tablet computer hybrid device, a laptop computer, a desktop computer, a computer monitor, a television, a webcam, a miniature surveillance camera, and an endoscope. In some instances, the optical axis is folded, and includes a first optical axis segment and a second optical axis segment, the second optical axis segment being non-parallel to (e.g., folded, transverse, or substantially perpendicular, relative to) the first optical axis segment. The first optical axis segment and the second optical axis segment can also be substantially perpendicular to each other.

In an embodiment, the functionality the MEMS zoom lens system is substantially unaffected by any of a gravitational force, an atmospheric pressure, and a physical movement of the MEMS zoom lens system. In some embodiments, at least one of the first and second pair of optical elements, and the imaging sensor, are configured to allow relative motion with respect to each other along the optical axis.

BRIEF DESCRIPTION OF THE DRAWINGS

FIG. 1 is a schematic illustration of a representative zoom lens system having two varifocal lenses in accordance with an exemplary embodiment.

FIGS. 2A and 2B are schematic illustrations of a zoom lens system having a varifocal lens that includes two closely spaced lens elements in accordance with an exemplary embodiment.

DETAILED DESCRIPTION

Figure 3:
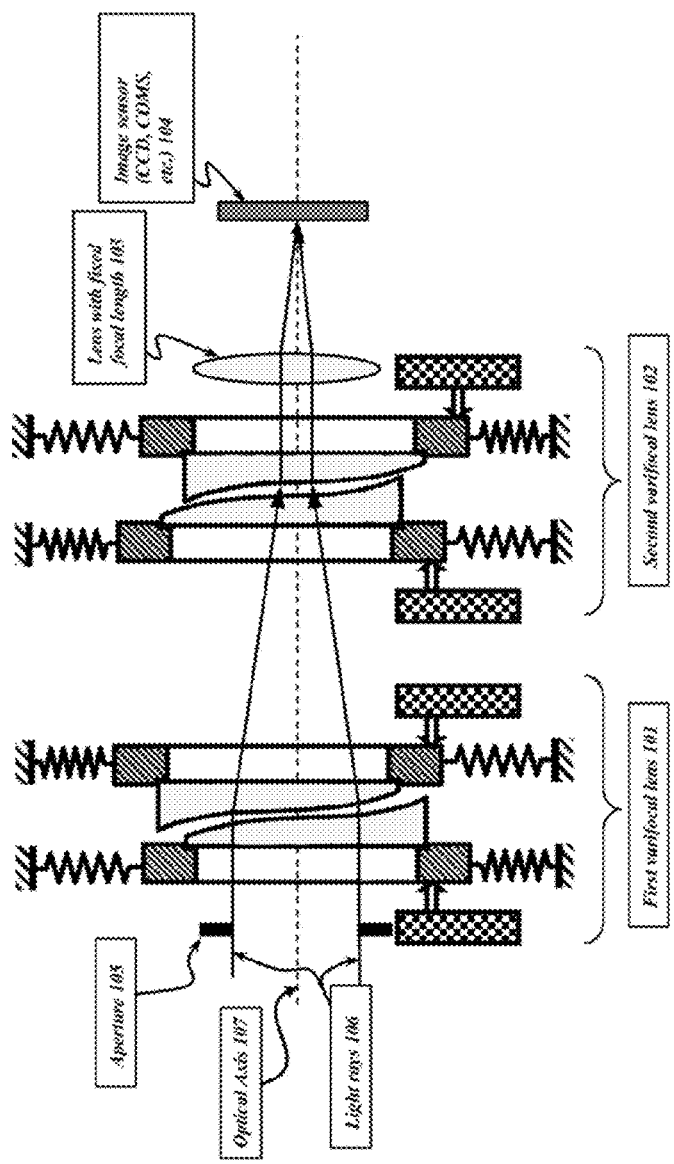
FIG. 3 is a schematic illustration of portions of a zoom lens system, apparatus, or module in accordance with an exemplary embodiment application.

In the present application, depiction of a given element or consideration or use of a particular element number in a particular FIG. or a reference thereto in corresponding descriptive material can encompass the same, an equivalent, or an analogous element or element number identified in another FIG. or descriptive material associated therewith.

In the present application, the word "exemplary" is used to mean serving as an example, instance, or illustration. Any embodiment or design described herein as "exemplary" is not necessarily to be construed as preferred or advantageous over other embodiments or designs. Rather, use of the word exemplary is intended to present concepts in a concrete manner.

Unless explicitly stated otherwise, in the description that follows, the recitation of particular numerical values or value ranges is taken to be a recitation of particular approximate numerical values or approximate value ranges. Thus, a given numerical value or value range provided below should be interpreted or defined as an approximate numerical value or value range.

As used herein, the term "set" corresponds to or is defined as a non-empty finite organization of elements that mathematically exhibits a cardinality of at least 1 (i.e., a set as defined herein can correspond to a singlet or single element set, or a multiple element set), in accordance with known mathematical definitions (for instance, in a manner corresponding to that described in *An Introduction to Mathematical Reasoning: Numbers, Sets, and Functions*, "Chapter 11: Properties of Finite Sets" (e.g., as indicated on p. 140), by Peter J. Eccles, Cambridge University Press (1998)). In general, an element of a set can include or be a system, an apparatus, a device, an element, a structure, a structural feature, an object, a process, a parameter, or a value depending upon the type of set under consideration.

In some embodiments of the present application, lens elements are configured (e.g., on a pairwise basis) to form composite lenses that correspond to an Alvarez or Lohmann lens configuration (e.g., complementary phase surfaces that are correlated in accordance with a third-order polynomial) or are generally analogous to such configurations. Alvarez/Lohmann lenses are paired optical elements having a complimentary or correlated cubic surface profile, which provide variations in optical power with small lateral (perpendicular to the optical axis) displacement, rather than axial (along the optical axis) displacements of the lens elements. The Alvarez or Lohmann lenses that are used in accordance with the disclosed embodiments can encompass lens element configurations having freeform surfaces that define Alvarez lenses or Lohmann lenses, and may have substantially freeform or quasi-freeform surfaces that define Alvarez type lenses or Lohmann type lenses. Embodiments in accordance with the present application can further encompass essentially any type of optical surface or lens configuration that can be carried and/or driven by a MEMS based assembly, and which can provide variable or selectable optical power based upon a transverse displacement of one or more optical surfaces or lens elements relative to an optical signal travel path or optical axis.

In other embodiments, the composite lens surfaces are correlated in accordance with a higher-than-third-order polynomial, for example a fifth-order polynomial or a seventh-order polynomial. Higher order polynomial lens address different aberrations, for example chromatic aberrations, and are able to also realize Alvarez-like pair-wise varifocal lenses.

FIG. 1 is a schematic illustration of a representative zoom lens system having two varifocal lenses, which is described hereafter to further aid understanding of Alvarez/Lohmann lens configurations. The system shown in FIG. 1 consists of two thin varifocal lenses F1 and F2 arranged in tandem, whose focal lengths, $f_1$ and $f_2$ respectively, are variable. The two varifocal lenses are fixed in position with a distance t from one another. An image sensor is placed at a distance d away from the second varifocal lens F2. The zoom lens system is configured to image an object located at a distance l from the first varifocal lens F1 onto the image sensor with a transverse magnification M defined as: $M=h_i/h_o$, where $h_i$ and $h_o$ are the heights of the image and object, respectively. For simplicity, assuming the zoom lens system is operated in air with a unit refractive index, the paraxial ray tracing equations are then:

$$u'_1 = u_1 - h_1 \phi_1 \tag{1}$$

$$h_2 = h_1 + u'_1 t \tag{2}$$

$$u_2 = u'_1 \tag{3}$$

$$u'_2 = u_2 - h_2 \phi_2 \tag{4}$$

where $u_1$ and $u_2$ are angles of the rays with respect to the optical axis in radians, $h_1$ and $h_2$ are heights of the impacts of the rays hitting the lens planes, and $\phi_1$ and $\phi_2$ are the optical powers of the lenses, namely, $\phi_1 = 1/f_1$ and $\phi_2 = 1/f_2$. It is also apparent that:

$$h_1 = l u_1 \tag{5}$$

$$h_2 = -d u'_2 \tag{6}$$

and, $$M = \frac{h_i}{h_o} = \frac{u_1}{u'_2} \tag{7}$$

Insert (5) into (1):

$$u'_1 = u_1(1 - l\phi_1) \tag{8}$$

Insert (6) into (4):

$$u'_2(1 - d\phi_2) = u_2 \tag{9}$$

Combine (3), (8), and (9), one obtains:

$$\frac{(1 - d\phi_2)}{(1 - l\phi_1)} = \frac{u_1}{u'_2} = M \tag{10}$$

Insert (1), (5), and (6) into (2):

$$-du'_2 = lu_1 + (1 - l\phi_1)tu_1 \tag{11}$$

Rearrange (11):

$$-\frac{d}{l + t - lt\phi_1} = \frac{u_1}{u'_2} = M \tag{12}$$

Solve (12) for $\phi_1$:

$$\phi_1 = \frac{1}{f_1} = \frac{l + t + (d/M)}{lt} \tag{13}$$

Insert (13) into (10) and solve for $\phi_2$:

$$\phi_2 = \frac{1}{f_2} = \frac{d + t + lM}{dt} \tag{14}$$

Here, we assume the overall focal length of this zoom lens system is $f_0$. For many photography applications, objects are typically located at a much larger distance away from the camera compared to the camera's focal length, i.e. $l \gg f_0$. Hence, the transverse optical magnification of the lens system can be approximated as:

$$M = -\frac{f_0}{l} \tag{15}$$

Insert (15) into (13) and (14):

$$\phi_1 = \frac{1}{f_1} = \frac{1}{l} + \frac{1}{t} - \frac{d}{f_0 t} \tag{16}$$

$$\phi_2 = \frac{1}{f_2} = \frac{1}{d} + \frac{1}{t} - \frac{f_0}{dt} \tag{17}$$

From (16) and (17), we observe that with the two varifocal lenses and the image sensor fixed in position (i.e. d and t are constants), for any object distance l together with a given overall focal length $f_0$, one can readily find suitable focal lengths $f_1$ and $f_2$ for the varifocal lenses F1 and F2, respectively, such that the lens system produces a sharp image of the object on the image sensor. This is also applicable to embodiments where the varifocal lenses and the image sensor are not fixed in position, e.g., where the lenses and sensor are in varying distances relative each other, subject to physical space constraints.

In other words, the lens system shown in FIG. 1 can continuously change its transverse optical magnification of an object through changing the overall focal length $f_0$ of the photographic system by simultaneously varying the focal lengths of F1 and F2 accordingly, and image can still remain sharp without moving the image sensor or the lenses. This is a desired function of a zoom lens system. From (16) and (17), to achieve autofocusing, i.e. to regain a sharp image of an object after it moves, relatively, away from or towards the lens system, one needs to change the focal length $f_1$ of the first lens F1 according to the change in object distance l. In summary, the combination of two varifocal lenses shown in FIG. 1 provides an optical zoom lens system with an autofocus function. Such a zoom lens system is suitable for miniaturization by way of a MEMS tunable varifocal Alvarez/Lohmann lenses.

Clearly, from (17), if we split the second varifocal lens F2 into two closely placed lenses F3 (fixed focal length) and F4 (variable focal length), whose optical powers are $\phi_3 = 1/d$ and $\phi_4 = 1/t - f_0/(dt)$, respectively, the imaging system will be essentially the same. The modified imaging system is shown in FIG. 2A and FIG. 2B. To image an object located at infinity ($l = \infty$), the focal lengths for the two varifocal lenses F1 and F4 in the system are:

$$f_1 = t + \frac{td}{f_0 - d} = \frac{tf_0}{f_0 - d} \tag{18}$$

$$f_4 = -\frac{td}{f_0 - d} = t - \frac{tf_0}{f_0 - d} \tag{19}$$

With further reference to FIGS. 2A and 2B, which are schematic illustrations of a zoom lens system having a varifocal lens that includes two closely spaced lens elements, it is straightforward for one of ordinary skill in the relevant art to deduce from (18) and (19) that:

1. When the system overall focal length $f_0$ is set at d, the values of $f_1$ and $f_4$ are both infinity. This means that the two varifocal lenses F1 and F4 are essentially two parallel optical plates with no optical power, the overall optical power of the system comes from the last lens F3 with a fixed focal length d.

2. If $f_0$ is set to be larger than d, then $f_1$ is positive and $f_4$ is negative, and the two varifocal lenses F1 and F4 form an afocal system, i.e. $f_1+f_4=t$, as shown in FIG. 2A. This system is equivalent to a telescope in conjunction with a fixed lens F3.
3. On the contrary, if $f_0$ is smaller than d, then $f_1$ is negative and $f_4$ is positive, and the two varifocal lenses F1 and F4 form an afocal inverted telescope system as shown in FIG. 2B.

Providing an embodiment including such a zoom lens system including a pair of varifocal lens, as illustrated by FIGS. 2A and 2B, allows for adaptability in the varying of the focal lengths $f_1$ and $f_4$ in the changing of system overall focal length $f_0$. Such an embodiment thus provides simplicities in implementing or solving the above equations and flexibility in handling the tuning parameters as desired, intended, or required.

A small lateral shift (relative to size) between two special lens elements arranged in tandem one immediately behind another can produce substantial variation in the optical power of the combination. The two elements may have thicknesses described by the following equations, respectively:

$$t_1 = A\left(xy^2 + \frac{1}{3}x^3\right) + Dx + E \qquad (20)$$

$$t_2 = -A\left(xy^2 + \frac{1}{3}x^3\right) - Dx + E \qquad (21)$$

where A is a positive constant, x and y are transverse coordinates normal to the optical axis z. The element's thickness is measured along the z axis. The combined thickness of the two-element system is then $t=t_1+t_2=2E$, which is equivalent to a parallel plate. Assuming that the first element moves a displacement of $\delta$ and the second moves $-\delta$ along the x direction, the combined thickness changes to:

$$t = t_1(x-\delta) + t_2(x+\delta) \qquad (22)$$

$$= -2A\delta(x^2+y^2) - \frac{2}{3}A\delta^3 - 2D\delta + 2E$$

The term $-2A\delta(x^2+y^2)$ describes a positive (converging) lens for positive displacement $\delta$ and a negative (diverging) lens for negative $\delta$. The other terms in Eq. (24) describe just a uniform thickness. The total optical power of the combination is then:

$$\phi = 4A\delta(n-1) \qquad (23)$$

where n is the refractive index of the lens material.

A similar dual-element composite varifocal lens, whose focal length is also tunable through lateral shifting the relative position of the two elements. This leads to the following thickness equations for such a lens elements configuration, which may also be known as the Lohmann configuration:

$$t_1 = A\left(\frac{1}{3}y^3 + \frac{1}{3}x^3\right) + D(x+y) + E \qquad (24)$$

$$t_2 = -A\left(\frac{1}{3}y^3 + \frac{1}{3}x^3\right) - D(x+y) + E \qquad (25)$$

If the first element displaced to $\delta_x$ and $\delta_y$ along the x and y axis respectively, and the second element displaced to $-\delta_x$ and $-\delta_y$, the total thickness of the composite lens is then:

$$t = t_1(x-\delta_x, y-\delta_y) + t_2(x+\delta_x, y+\delta_y) \qquad (26)$$

$$= -2A(\delta_x x^2 + \gamma_y y^2) - \frac{2}{3}A(\delta_x^3 + \delta_y^3) - 2D(\delta_x + \delta_y) + 2E$$

If the two displacements are equal, i.e. $\delta_x = \delta_y = \delta$, the thickness t becomes:

$$t = -2A\delta(x^2+y^2) - \frac{4}{3}A\delta^3 - 4D\delta + 2E \qquad (27)$$

Again, neglecting the uniform thickness terms, this dual-element combination is equivalent to a lens with optical power: $\phi = 4A\delta(n-1)$.

As described above, the Alvarez lens and Lohmann lens achieve focal length tuning by laterally shifting lens elements in directions normal to the optical axis. Various embodiments of the present application provide for integration of such a lens system including lens elements that are movable relative to the other transversely to the optical axis of the lens, with MEMS actuators. Further, advantageous features such as autofocus, aberration correction and variable aperture to suit wide-angle and telephoto applications are provided in embodiments according to the application.

The present application provides a zoom lens system that is MEMS-based. Having a MEMS-based system means that the provision of the aforementioned two functions, namely autofocus and optical zooming, can be successfully realized in a miniature, unified, reliable, and robust structure. Further, in adapting or employing state of the art microfabrication (e.g., semiconductor fabrication) processes for manufacturing the MEMS-based system, cost effectiveness is provided in up-scaling production. The miniaturization and replacement of a conventional zoom lens system with a MEMS-based zoom lens system according to the present application further avoids or substantially avoids loss of image quality as a physical manipulation of the lens system is carried out, as compared to digital manipulation of a digitally captured image. An ease of control is also obtained with the MEMS-based zoom lens system of the present application, as only a small lateral displacement of the varifocal lenses is required to achieve optical zooming and/or autofocus, whereas conventional lens systems require lens groups to move substantial distances along the optical axis.

Representative Aspects of MEMS-Based Zoom Lens System Embodiments

FIG. 3 is a schematic illustration of portions of a zoom lens system, apparatus, or module in accordance with an embodiment of the present application. The system includes a first varifocal lens (101) and a second varifocal lens (102) that are cooperatively arranged (e.g., in tandem) along an optical signal travel path or an optical axis (107). In some exemplary embodiments, the first and second varifocal lenses (101, 102) are fixed in position and separated by a fixed gap distance. In other exemplary embodiments, the first and second varifocal lenses (101, 102) can vary in position such that gap between the two lenses can vary within a particular range. Each varifocal lens (101, 102) includes a pair of lens elements that are carried by a MEMS-based displacement apparatus which is configured to move, translate, or displace varifocal lens elements laterally, transversely, substantially transversely, or normal to an optical signal travel path through the lens elements, such as the optical axis 107, for varying varifocal lens focal length. As further described herein, a MEMS-based displacement apparatus can include a platform configured to carry a lens element; and a flexure suspension that couples the platform to a reference or fixed support structure. The flexure suspension is configured for elastic deformation along a direction transverse to the optical axis (107), such that the platform can be selectively and elastically displaced transverse to the optical axis (107) by way of a set of drive mechanisms that includes a microactuator.

The system is configured to image an object, or multiple objects, or a scene onto an image capture device or sensor (104) that converts optical signals or images to electrical signals for processing and/or storage. The overall focal length of the imaging system can be varied continuously within a range by adjusting the focal lengths of the two varifocal lenses accordingly, thus producing a desired zoom effect, i.e. changing the transverse optical magnification of the imaging system.

In various embodiments, when elements of the system are adjusted to provide a desired overall system focal length for a chosen optical magnification, the focusing or autofocus function of the system is not achieved by moving the optical elements or image sensor longitudinally relative to each other along the optical signal travel path or optical axis (107), but rather it is achieved by varying the focal length of the first varifocal lens (101) by an additional amount according to the distance from the object to the lens system.

One or more additional, associated, or adjunctive lens elements or plates (103) having spherical, aspherical, or freeform surfaces can be included in or incorporated into zoom imaging systems in various embodiments for improving performance of the zoom lens system, such as providing additional optical power and/or for aberration reduction, minimization, or correction purposes. Such additional lens elements (103) can have fixed focal lengths, and can be longitudinally and/or transversely fixed with respect to the optical axis.

Additionally or alternatively, in some embodiments, structural and/or material property aspects of one or more varifocal lenses (101, 102) can be varied or modified to facilitate aberration reduction, minimization, or correction. For instance, an initially defined set of optical element surfaces that implement freeform surfaces in the manner proposed by Alvarez or Lohmann can be modified or adapted to include additional design degrees of freedom to facilitate aberration correction. As a representative example, for an initially defined Alvarez lens having a freeform surface, a function f(x,y) can be mapped onto or included or incorporated into the thickness profiles of its constituent lens elements, resulting in the definition or generation of an Alvarez type lens having an essentially freeform, substantially freeform, or quasi-freeform surface. Equations (20) and (21) above then become:

$$t_1 = A\left(xy^2 + \frac{1}{3}x^3\right) + Dx + f(x, y) + E \qquad (28)$$

$$t_2 = -A\left(xy^2 + \frac{1}{3}x^3\right) - Dx - f(x, y) + E \qquad (29)$$

Assuming that a first lens element moves a displacement of $\delta$ and a second lens element moves $-\delta$ along the x direction, the combined thickness changes to:

$$t = t_1(x - \delta) + t_2(x + \delta) \qquad (30)$$

$$= -2A\delta(x^2 + y^2) + \left(-\frac{2}{3}A\delta^3 - 2D\delta + 2E\right) +$$

$$f(x - \delta, y) - f(x + \delta, y)$$

Hence, $$t = -2A\delta(x^2 + y^2) + \text{Constant} + g(x, y), \qquad (31)$$

where $$g(x, y) \approx -2\delta\left(\frac{\partial f}{\partial x}\right) \qquad (32)$$

for small lateral offset $\delta$. Similarly, in the above equation (31), the first term on the right-hand side provides a spherical wavefront for diverging or focusing light, with variable focal length determined by $\delta$. The second term $(-2A\delta^3/3 - 2DE + 2E)$ is a constant and does not have significant contribution to the system. The last term g(x,y) provides a slight deviation to the spherical wavefront described by the first term, and if properly designed, can be utilized to improve various aspects of the zoom lens systems, such as reducing or minimizing the optical aberration(s) of the system. It should also be noted that zoom lens systems in accordance with the embodiments of the present application can be designed by a combination of both techniques indicated above for optical aberration reduction, minimization, or correction, as well as for providing other system improvements such as increasing or adjusting the optical power.

An aperture (105) can also be incorporated in the system to limit the size of a bundle of rays entering the lens system. In accordance, in some embodiments, a variable aperture whose diameter can be adjusted is utilized. This can be understood more clearly by referring again to FIGS. 2A and 2B. When the zoom lens system is tuned to wide-angle configuration, bundles of rays passing through the first varifocal lens (101) diverge towards the second varifocal lens (102). Thus, their sizes are enlarged when they impact on the second varifocal lens (102). In addition, the imaging system of this configuration has a wider field of view (FOV). Hence, considering the limited size of the second varifocal lens (102), the aperture (105) may need to be adjusted to a relative smaller diameter to limit the size of ray-bundles entering the lens. On the contrary, when the zoom lens system is tuned to a telephoto configuration, the rays passing through the first varifocal lens (101) converge towards the second varifocal lens (102). In addition, the telephoto imaging system has a smaller FOV. In this case, a larger diameter of the aperture may be adopted.

Figure 4:
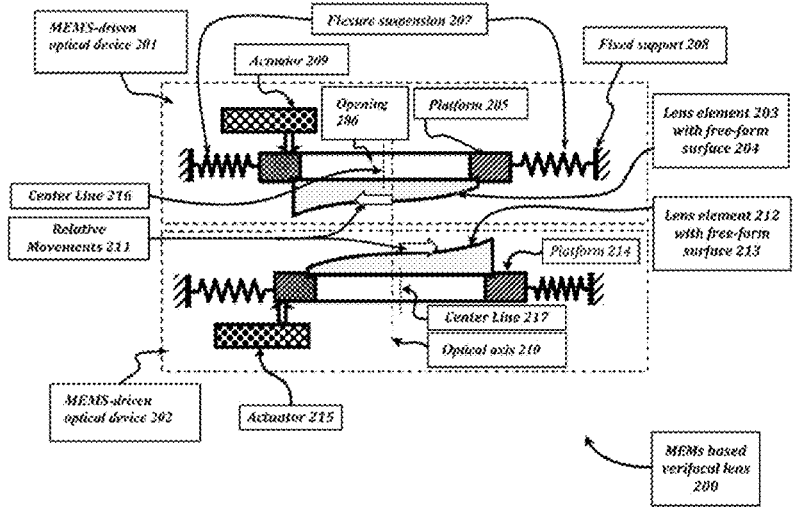
FIG. 4 is a schematic illustration of a MEMS-based varifocal lens in accordance with an exemplary embodiment, which includes a pair of MEMS-driven optical elements or devices.

FIG. 4 is a schematic illustration of a MEMS-based varifocal lens (200) in accordance with an embodiment of the present application, which includes a pair of MEMS-driven optical components, elements, devices, or structures. In the embodiment shown, a varifocal lens in the imaging system includes two MEMS-driven optical devices (201, 202). Each MEMS-driven optical device (201, 202) has a lens element (203, 212) with at least one freeform surface (204, 213) and is mounted on a support structure such as a platform (205, 214). In various embodiments, the platform (205) includes a planar or generally planar structure having a first side providing a first planar surface area; a second side providing a second planar surface area; and a thickness between the first and second sides. The platform (205) is configured to carry a lens element (203) such that the optical axis (210) of the lens element (203) is substantially perpendicular to the first and second planar surface areas. The platform (205) can include an opening (206) or an optically transparent region through which light can access and travel through the MEMS-based varifocal lens.

The platform (205) is coupled or attached to at least one reference support structure or fixed support (208) through an elastically deformable or flexure suspension system (207). The reference support structure or fixed support (208) can provide a spatial or positional reference relative to which displacement, translation, or motion of the platform (205) transverse to an optical signal travel path (e.g., the optical axis) through the lens element (203) and/or other system structures can be established, determined, or measured. In various embodiments, the flexure suspension provides a certain range of platform movement through elastic deformation. In accordance with some embodiments, the suspension system (e.g., an elastically deformable or flexure suspension system) can be used to improve various characteristics of the optical zoom systems, such as reducing, minimizing or avoiding contact between surfaces, thus reducing, minimizing, or eliminating friction, wear, and tear. This helps to reduce the driving voltage for actuation and also aids accurate positioning.

In the present embodiment, the varifocal lens includes a first lens element (203) with free form surface (204) and a corresponding second lens element (212) with free form surface (213). The first lens element (203) is carried by a platform (205), and a microactuator (209) drives the platform (205) carrying the lens element (203), such that the platform (205) and the lens element (203) move laterally together in a direction perpendicular to the optical axis (210). The second element (212) is similarly provided on platform (214) and driven by microactuator (215) to move in lateral movement correspondingly. The relative movement (211) between the two lens elements causes the composite lens formed by them to vary the focal length. A center line (216) of the first lens element (203) is provided for reference. It is noted that the center line (216) is provided as a thickness profile variation reference of the freeform surface (204). It need not be necessarily aligned to the geometric centers of the first lens element (203) and the opening (206), although in some cases such alignment is preferred. The second lens element (212) is referenced with a corresponding center line (217). Relative movement of the first lens element (203) and the second lens element (212) is monitored by way of a center-to-center offset, wherein the center line (216) of the first lens element (203) is relatively compared with the center line (217) of the corresponding second lens element (212). If the center lines (216) and (217) coincide with each other, the varifocal length lens (200) has a substantially large focal length. The focal length of the varifocal lens (200) can also be derived from the center-to-center offset.

Present microactuators typically have a limited maximum displacement/stroke of a few tens of micrometers. For example, the maximum stroke of an electrostatic comb drive microactuator is limited by the electrostatic side-pulling phenomenon. In various zoom lens system embodiments in accordance with the present application, moderate or large lateral displacements of lens elements driven by microactuators result in large variations in the optical power of the varifocal lenses, which further translates to a large optical zoom range of the zoom lens system. Particular embodiments of the present application can achieve or provide an optical magnification of at least approximately 2×. This can be important or highly desirable for multiple types of imaging systems, for example, miniature cameras for smart phones.

One manner of enhancing lateral lens element displacement in accordance with the present application is described hereafter.

Figure 5:
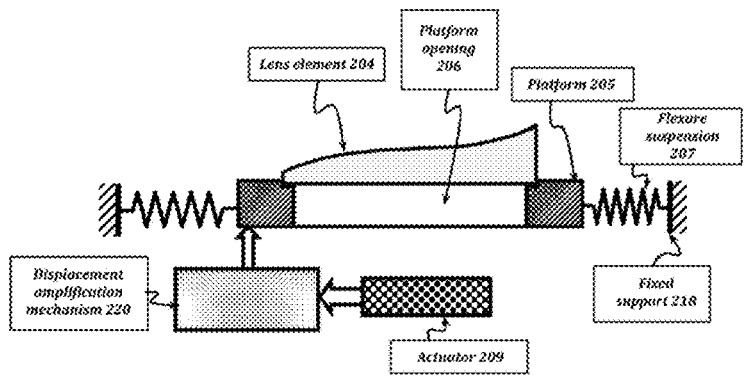
FIG. 5 is a schematic illustration of a MEMS-driven optical device coupled to a displacement amplification apparatus, device, element, or mechanism in accordance with an exemplary embodiment.

FIG. 5 is a schematic illustration of a MEMS-driven optical device (e.g. which includes a lens element, a platform configured to carry the lens element, and a flexure suspension coupled between the platform and a reference or fixed support structure, where the flexure suspension is configured for elastic deformation in a direction transverse to an optical signal travel path or optical axis through the lens element) coupled to a displacement amplification apparatus, device, element, or mechanism (220) in accordance with an embodiment of the application, which can overcome the stroke limitation associated with typical microactuators. Instead of directly driving the platform (205), the microactuator (209) is coupled or indirectly attached to the platform (205) by way of a displacement amplification mechanism (220). A variety of displacement amplification mechanism (220) designs, ranging from simple leverage mechanisms to complex compliant amplifying mechanisms, are currently available in the literature and can be used together with the present embodiments.

Figure 6:
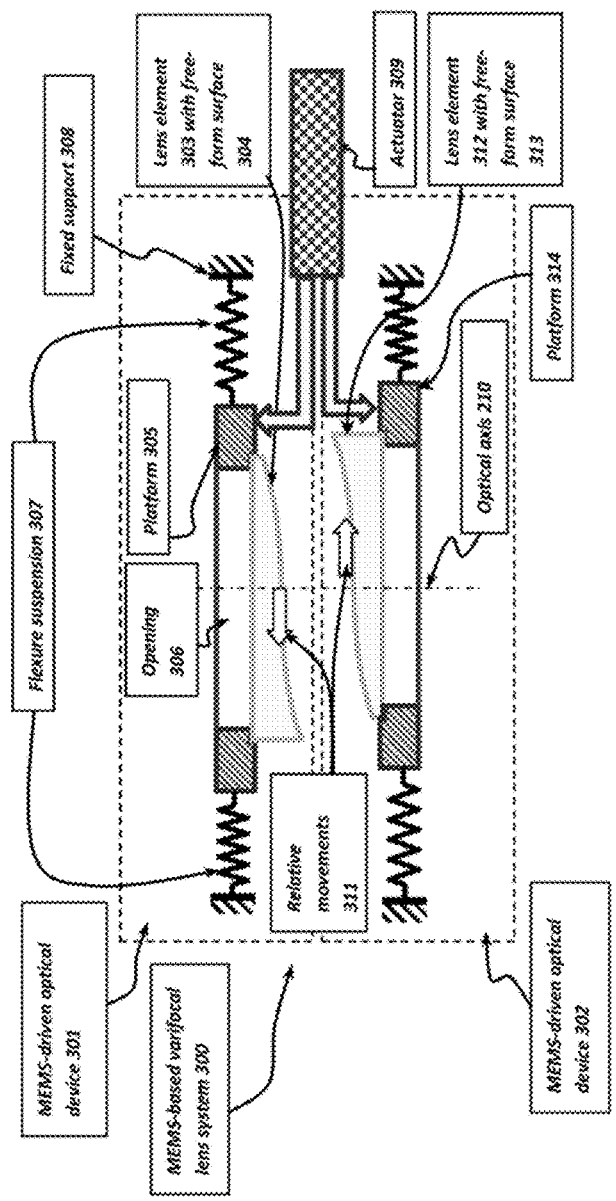
FIG. 6 is a schematic illustration of a MEMS-based varifocal lens in accordance with another exemplary embodiment.

FIG. 6 is a schematic illustration of a of a MEMS-based varifocal lens in accordance with another exemplary embodiment of the present application. A varifocal lens in the imaging system includes two MEMS-driven optical devices (301, 302). Each MEMS-driven optical device (301, 302) has a lens element (303, 312) with at least one freeform surface (304, 313) and is mounted on a support structure such as a platform (305, 314). In the embodiment, a single actuator (309) is provided to vary the center-to-center offset of the two constitutional lens elements (303, 312).

An implementation of a driving system supporting the actuator (309) in displacing the lens elements (303, 312) can include attaching an electromagnet on one platform (305) and a corresponding permanent magnet or electromagnet on the other platform (314). By varying the electromagnetic field of the electromagnet, the two platforms can be attracted or repelled with respect to each other, causing relative movements between the two lens elements (303, 312). This is enabled by the proximity of the two optical devices (301, 302) to each other. Other implementations of such a supporting driving system could employ electrostatic, electrothermal, piezoelectric, and/or any other workable solutions.

To achieve widespread deployment or use of miniature zoom systems in accordance with the present application, low-unit-cost and/or high-volume mass production are desirable or essential. In some embodiments, the MEMS actuator and the lens element are fabricated through an IC-like microfabrication process. In a technique, an entire integrated MEMS-driven optical device having an Alvarez or Lohmann lens element can be fabricated through a single IC-like microfabrication process which allows for alignment and assembly of components to be removed from the manufacturing process.

In another technique, the MEMS actuator and lens element are fabricated separately by way of different or distinct processes, and then finally assembled to construct a MEMS-driven optical device in accordance with embodiments of the present application and described herein. This technique can be more practical, as it can offer a better optical quality of the lens element while still maintaining a low-cost and high-volume production process.

Figure 7:
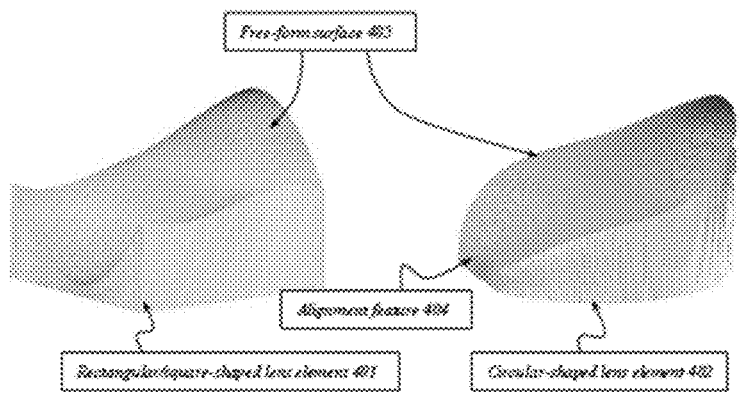
FIG. 7 is a schematic illustration of a freeform surface corresponding to an Alvarez lens element in accordance with an exemplary embodiment.
Figure 8:
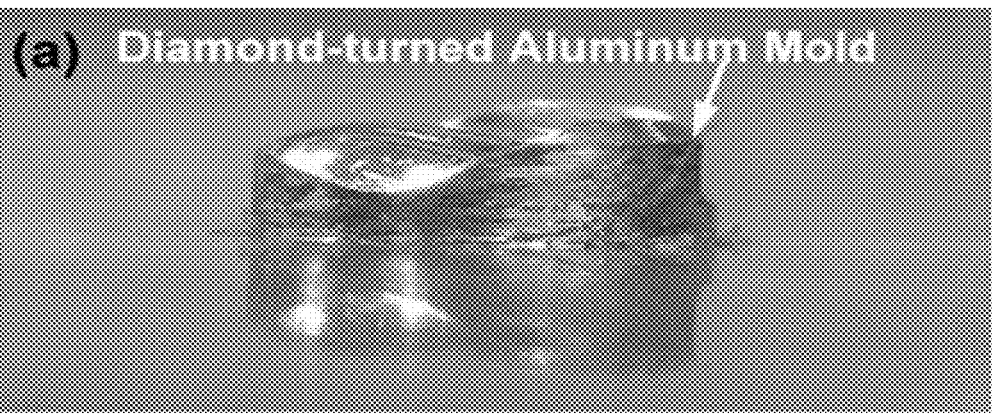
FIG. 8 is an illustration of a mold used in the fabrication of an Alvarez lens element in accordance with an exemplary embodiment.

FIG. 7 is a schematic illustration of a freeform, essentially freeform, substantially freeform, or quasi-freeform surface (403) corresponding to an Alvarez lens element in accordance with an embodiment of the present application. The lens element can be square/rectangular-shaped (401), circularshaped (402), or otherwise-shaped depending upon embodiment details. FIG. 8 is an illustration of a mold used in the fabrication of an Alvarez lens element in accordance with an embodiment. The mold (405) comprises a freeform surface as desired on a resultant Alvarez lens. The mold (405) is fabricated via an ultra-precision diamond turning/machining process which is able to manufacture with precision complex surfaces, and is very useful for miniature optical applications. Single-point diamond turning is presently used, in which a diamond-tipped lathe tool is used in the final stages of a molding process to achieve precise surface finish and form accuracies. Aluminum is used presently as material for the mold, but copper, zinc, silver or any other machinable materials can be used.

Figure 9:
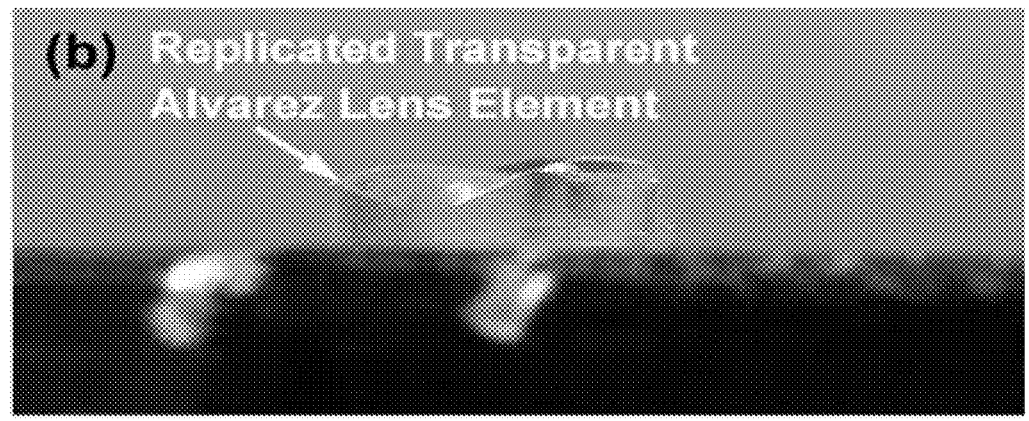
FIG. 9 is an illustration of a replicated lens element in accordance with an exemplary embodiment.

Conventional plastic optics manufacturing techniques, for example precision molding processes, can then be used to fabricate the lens element using the diamond-turned mold. FIG. 9 is an illustration of a replicated lens element in accordance with an embodiment. In the embodiment, an optical adhesive which is curable with ultra-violet (UV) light is used with the mold for the fabrication of the Alvarez lens element (406), the lens element (406) including a freeform surface (403) as desired. A combination of the single-point diamond turning to create the mold and the precision molding process to fabricate the lens element allows for low cost mass production.

In view of the working principle of the Alvarez and Lohmann lenses, accurate alignment of a freeform, essentially freeform, substantially freeform, or quasi-freeform surface of a lens element to the microactuator's motion direction is important or critical for high or best optical performance. Considering the Alvarez lens, for example, the movement direction of the actuator must be aligned precisely to the x-axis of the free-from surface described in Eq. (20). Misalignment errors may induce undesirable optical aberrations during tuning of the lens focal length. To facilitate the alignment process of the lens element relative to a lens element carrying structure (e.g., a platform) and/or a set of actuators such as a MEMS microactuator or a MEMS actuator configured to cooperatively operate with a displacement mechanism, a set of alignment features or orientation indicators identifying at least one freeform surface reference axis (e.g., an x- and/or a y-axis) transverse to a thickness profile variation axis (e.g., a z-axis) along which the thickness or thickness profile of the freeform surface varies can be incorporated in the lens element during its fabrication process, for example, in a diamond turning process. For a generally square/rectangular lens element, one or more of its peripheral borders or edges may be used for this purpose. For a circular lens element, an identifying reference such as a mark or additional cut at its circumference (404) can be used to indicate the direction of a selected axis.

Essentially any type of MEMS actuators can be used for moving the platform together with the lens element laterally, i.e., perpendicular to the optical axis, to implement the zoom and autofocus functions of the lens systems in accordance with the present application. These include, but are not limited to, electrothermal actuators (e.g. V-beam actuators, bimorph actuators, and pseudo-bimorph actuators), electrostatic actuators, electromagnetic actuators, and piezoelectric actuators. It should be noted that various MEMS actuators and their variations are possible within the spirit and scope of the application, as will become apparent to those of ordinary skill in the art.

Figure 10:
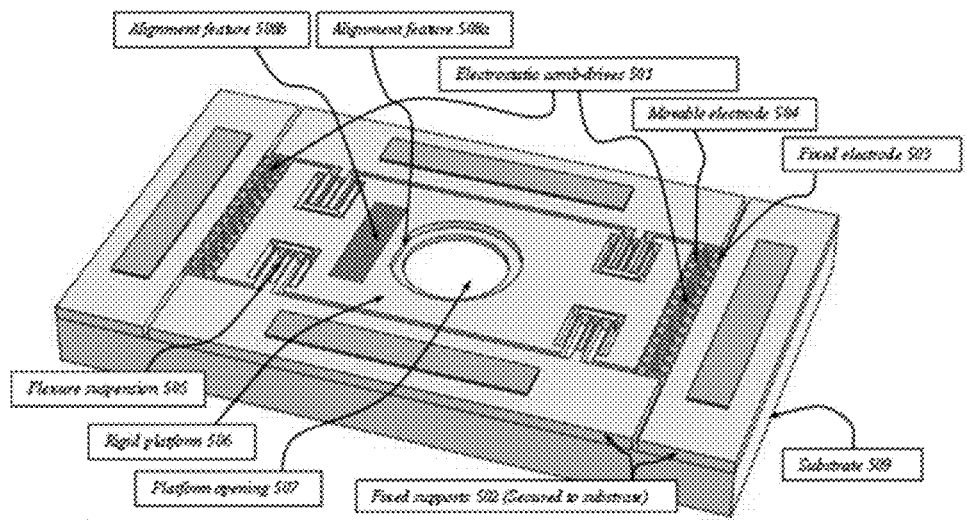
FIG. 10 is a schematic illustration of a lens displacement assembly in accordance with an exemplary embodiment, which includes a suspended MEMS platform and a comb-drive actuator.

FIG. 10 is a schematic illustration of a lens displacement assembly in accordance with an embodiment of the present application, which includes a suspended MEMS platform and a comb-drive actuator. As shown in FIG. 10, the rigid platform (506) with a through-hole opening (507) is driven by a set of electrostatic comb-drives (501). Each comb-drive includes a movable comb-like electrode (504) and a fixed comb-like electrode (503). The movable electrode (504) is attached to the rigid platform (506), and the fixed electrode (503) is attached to the fixed support (502) that is secured to the substrate (509). The two electrodes are separated by a gap. When a driving voltage is applied, an electrostatic force is produced by the electrodes (503, 504), causing the platform (506) to move in a plane parallel to the surface of the substrate (509). The rigid platform (506) is coupled to the fixed supports (502) through flexure suspensions (505). The movement of the rigid platform (506) is supported by elastic deformation of the flexure suspension (505), thus reducing, minimizing, or eliminating friction, wear, and tear. Alignment features, for example, representative features (508a) and (508b) depicted, can also be incorporated in MEMS actuation device(s) to facilitate its assembly process with the Alvarez or Lohmann lens element.

Figure 11:
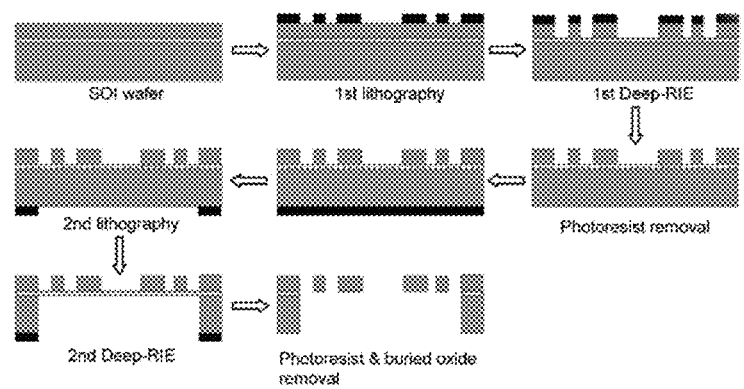
FIG. 11 is a schematic illustration of a MEMS fabrication process in accordance with an exemplary embodiment, which indicates a manner in which comb-drive actuators together with a rigid platform can be fabricated using standard SOI micromachining processes.

FIG. 11 is a schematic illustration of a MEMS fabrication process in accordance with an embodiment of the present application, which indicates a manner in which the above-mentioned comb-drive actuators together with the rigid platform can be fabricated using standard SOI micromachining processes. The fabrication begins with a double-side polished SOI wafer. A first lithography step followed by a Deep-RIE step can be used to fabricate the desired microstructures (including comb-drives, rigid platform, and flexure suspensions) into a top Si device layer. After that, a residual photoresist layer is removed. Subsequently, a second lithography and Deep-RIE steps are performed in sequence on the backside of the SOI wafer, namely, substrate side, to make an opening in the substrate right under the microstructure region. By removing the photoresist and the exposed buried oxide, the movable microstructures can be released and the fabrication of MEMS actuators and the platform for mounting the lens element is complete.

Figure 12A:
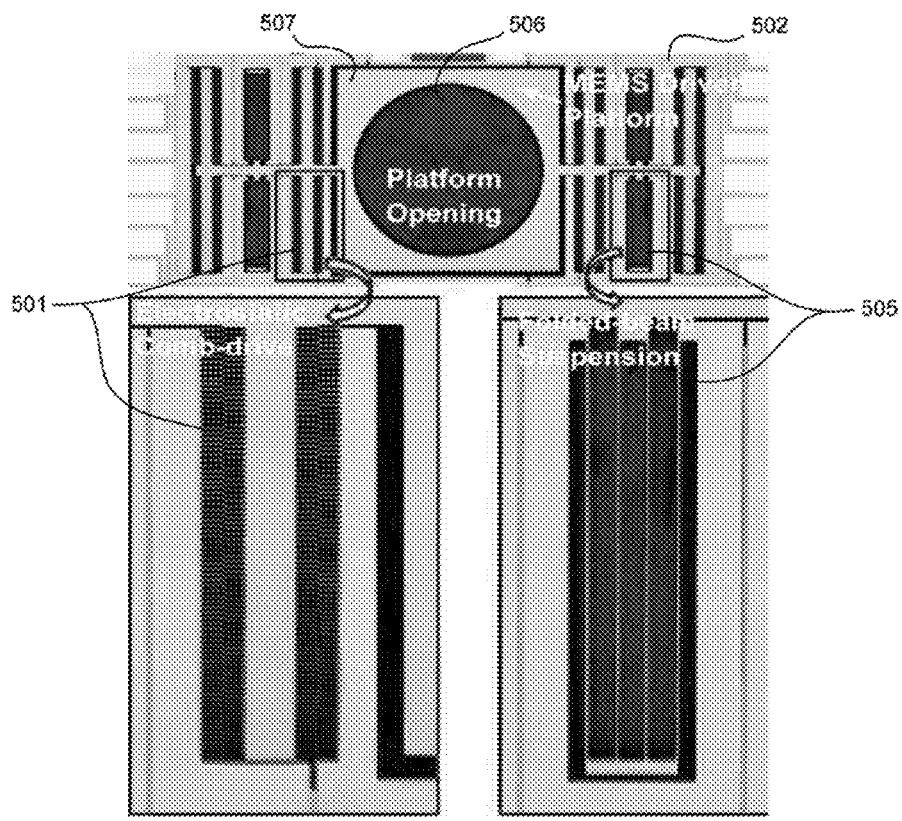
FIG. 12a is a representative illustration of the lens displacement assembly of FIG. 10 as fabricated in accordance with an exemplary embodiment.
Figure 12B:
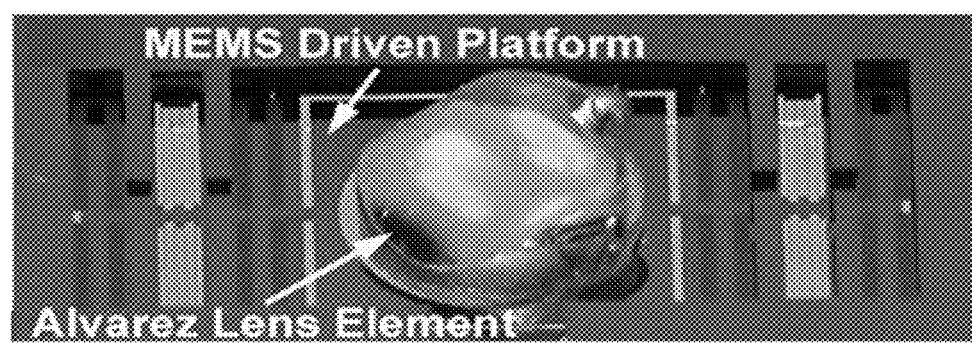
FIG. 12b is a representative illustration of the lens displacement assembly of FIG. 12a with an aligned and arranged Alvarez lens element in accordance with an exemplary embodiment.

FIG. 12a is a representative illustration of the lens displacement assembly of FIG. 10 as fabricated. MEMS-driven platform (506) is coupled to the fixed support (502) through flexure suspensions, which are realized in this set up as MEMS-type folded beam suspensions (505). Electrostatic comb drives (501) drive the rigid platform (506). Folded beam suspensions provide a high stiffness in a direction substantially transverse to the driving force of the comb drive actuators (501), while allowing relatively free movement in the direction of the comb drive actuators driving force. The platform (506) comprises a through-hole opening (507) for the arrangement of an Alvarez or Lohmann lens, according to the application. FIG. 12b is a representative illustration of the lens displacement assembly of FIG. 12a with an Alvarez lens element (510) aligned and arranged onto the rigid platform.

Figure 13:
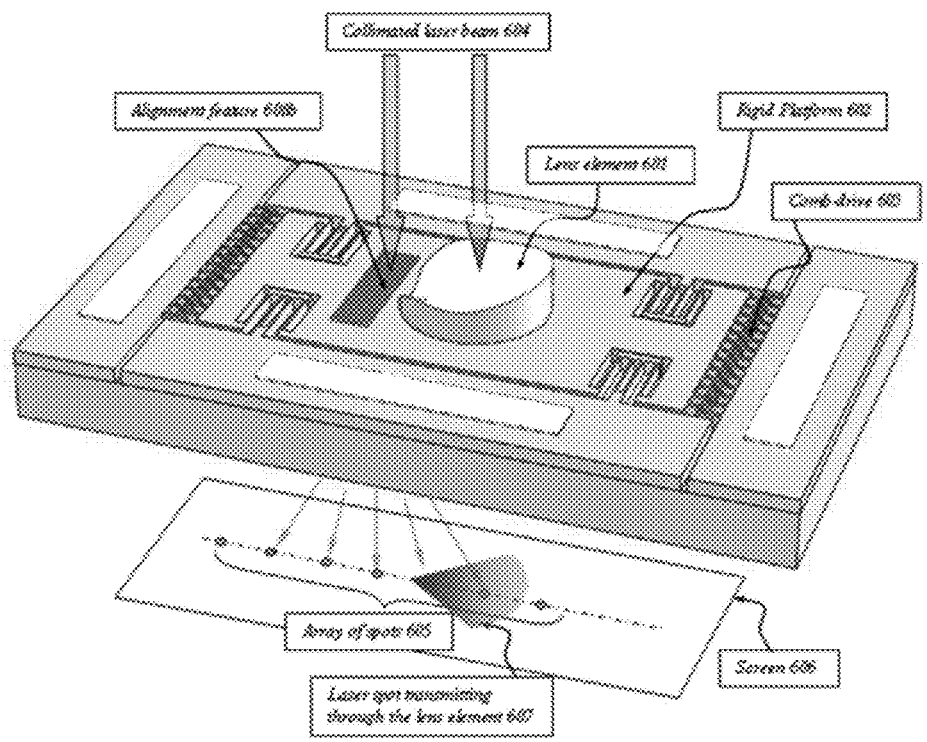
FIG. 13 is a schematic illustration showing portions of an assembly and/or alignment process in accordance with an exemplary embodiment, which involves a MEMS electrostatic comb-drive actuator and an Alvarez or Lohmann lens element.

FIG. 13 is a schematic illustration showing portions of an assembly and/or alignment process in accordance with an embodiment of the present application, which involves a MEMS electrostatic comb-drive actuator and an Alvarez or Lohmann lens element. In an embodiment, following their respective fabrication processes, the lens element (601) and the MEMS assembly having the rigid platform (602) and the electrostatic comb-drives (603) can be cooperatively coupled or combined through a micro assembly process to form a MEMS-driven optical device as a part of the varifocal lens in accordance with embodiments of the present application. A wide variety of techniques, ranging from utilizing UV/thermal curable epoxy to mechanical clamp designs on the platform, can be used to secure, mount, or fix the lens element on the rigid platform. Prior to fixing the lens element, it should be aligned precisely to the MEMS actuator. This can be done under a microscope with the help of micro-manipulators or tweezers to match the alignment features, for example, features (508a) indicated in FIG. 10 and/or features (404) indicated in FIG. 7, fabricated on both the rigid platform and the lens element, respectively.

Laser assisted alignment technology can also be used. For example, as shown in FIG. 13, a transmissive diffraction grating alignment feature (608b) can be integrated in a portion of a MEMS assembly, such as the MEMS actuator. When illuminated with a collimated laser beam (604), the grating diffracts the laser light and projects an array of spots (605) on a screen (606) located at a distance away from the MEMS device. The orientation of the grating alignment feature (608b) on the MEMS device is designed such that the direction of the diffracted spot array (605) indicates the MEMS actuator's movement direction. Since the lens element typically contains a freeform cubic surface profile, the laser spot transmitting through it (607) is not circularly symmetric and has distinct features indicating the orientation of the lens element (601). Hence, with the use of a laser beam and through comparing the orientation of laser spot (607) through the lens element and the direction of the diffraction spot array (605) on the screen, accurate or highly precise alignment of the desired axis of the lens element with respect to the movement direction of the MEMS actuator can be achieved.

Figure 14:
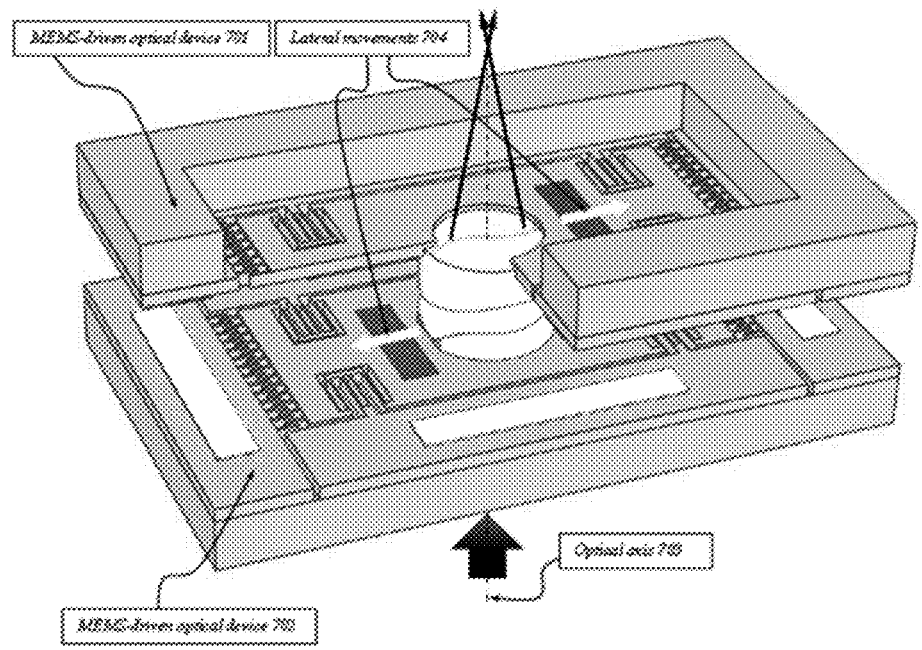
FIG. 14 is a schematic illustration of a MEMS based varifocal lens having two MEMS-driven optical devices in accordance with an exemplary embodiment.

FIG. 14 is a schematic illustration of a MEMS based varifocal lens having two MEMS-driven optical devices in accordance with an embodiment of the present application. As shown in FIG. 14, by lining up two assembled MEMS-driven optical devices (701, 702) in tandem, a varifocal lens is formed. In the embodiment shown, the optical axis (703) is normal to the surface of the MEMS actuator and extends through the center of the varifocal lens. The relative lateral movements (704) of the lens elements induced by the MEMS actuators control and tune the focal length of the varifocal lens. As shown schematically in FIG. 3, a pair of such MEMS-driven varifocal lenses constitutes a key component of miniature zoom lens systems with autofocus function in accordance with the present application.

As mentioned above, many MEMS actuators including electrostatic comb-drive actuators have a limited travel range. To overcome this limitation and to achieve a larger or large focal length tuning range or zooming range, mechanical displacement amplification mechanisms can be utilized. A representative example illustrating a manner in which a MEMS-driven optical device in accordance with an embodiment of the application can be configured to include a displacement amplification mechanism that is coupled to each of a MEMS actuator and a lens displacement apparatus such as a rigid platform is described hereafter.

Figure 15:
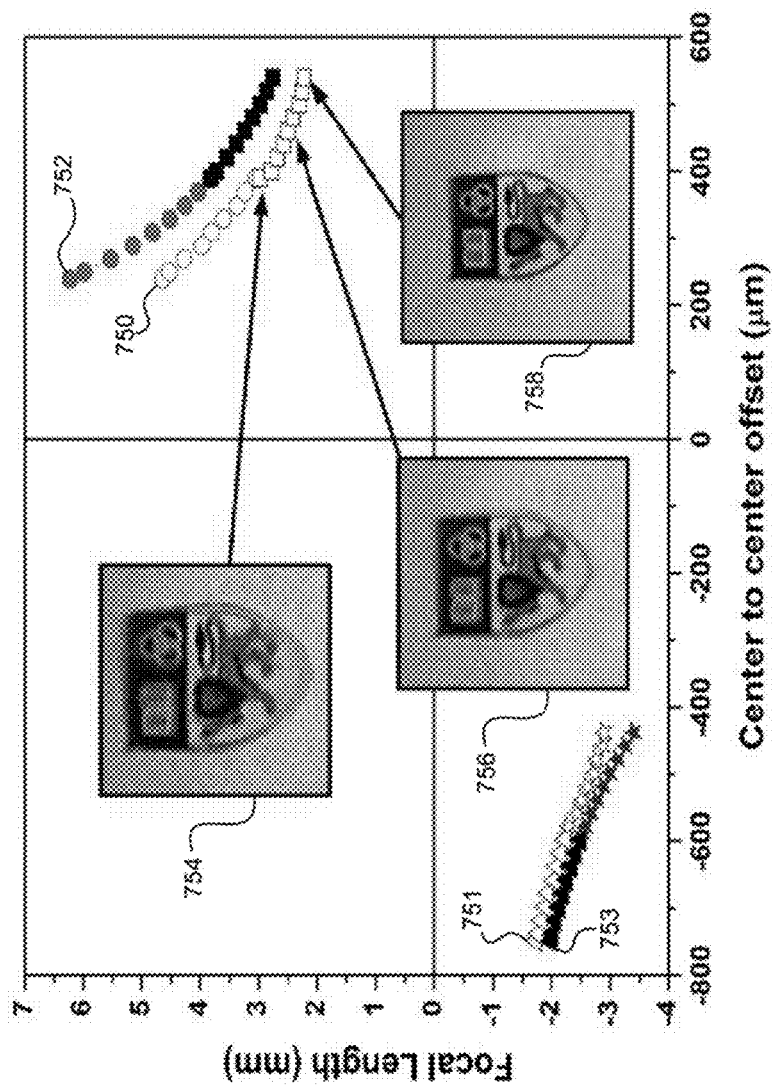
FIG. 15 is a plot compiling experimental data obtained from testing a fabricated MEMS based varifocal lens in accordance with an exemplary embodiment.

FIG. 15 is a plot compiling experimental data obtained from testing a fabricated MEMS based varifocal lens in accordance with the present application. The fabricated MEMS-driven Alvarez lens elements comprise a focal length which is adjustable through applying driving voltages to the comb drive actuators The focal length is measured experimentally and plotted as a function of center-to-center offset of the two lens elements. These are shown as unshaded symbols (750, 751) in FIG. 15. The shaded symbols (752, 753) show the theoretically predicted focal lengths from the free-form surface profile used. Both positive displacement (750, 752) and negative displacement (751, 753) of the MEMS driven Alvarez lens elements are tested. A good correlation to the theoretical predictions is observed.

As a further test, a printed logo is imaged by this adjustable lens as an object, which is placed at a fixed distance to the lens. The recorded images at three different focal lengths (754, 756, 758) are also provided in the figure. It can be seen from the change in size of the derived images (754, 756, 758) that the optical magnification is varied due to the change in focal length of the MEMS-driven Alvarez lens elements.

Figure 16:
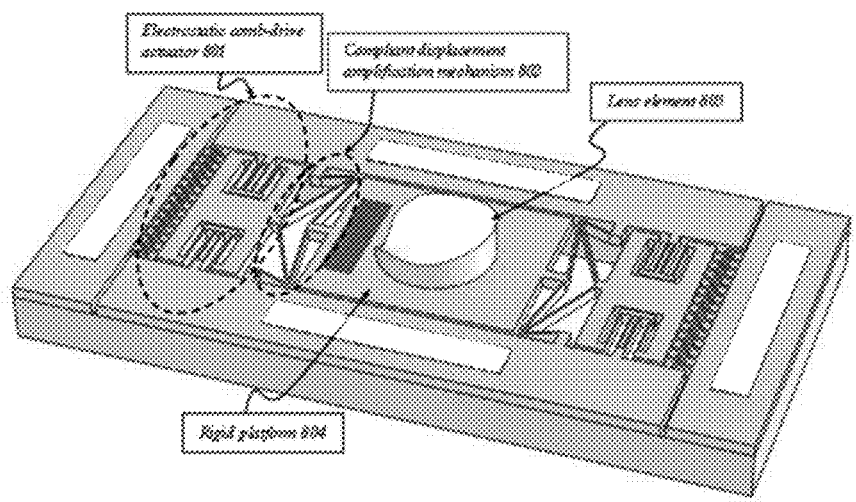
FIG. 16 is a schematic illustration of a MEMS-driven optical device in accordance with an exemplary embodiment, which includes a MEMS electrostatic comb-drive actuator, an Alvarez or Lohman lens element, and a displacement amplification mechanism.

FIG. 16 is a schematic illustration of a MEMS-driven optical device in accordance with an embodiment of the present application, which includes a MEMS electrostatic comb-drive actuator, an Alvarez or Lohman lens element, and a displacement amplification mechanism. In the embodiment shown, the electrostatic comb-drive actuator (801) is indirectly coupled to the rigid platform (804) having the lens element (803) through a compliant displacement amplification mechanism (802) that includes flexure beams. The details of the working principle of the displacement amplification mechanism can be found in the art. The output displacement of the MEMS actuator is amplified by the mechanism, thus making the actual displacement of the rigid platform (804) much larger than the displacement output of the driving actuator itself. A wide variety of displacement amplification mechanisms ranging from simple leverage mechanisms to complex compliant amplification mechanisms are available and reported in the literature. The microfabrication and assembly processes of this embodiment are identical, essentially identical, or analogous to those of the embodiment shown in FIG. 10 without the displacement amplification mechanism.

In some exemplary embodiments, depending upon embodiment details, a MEMS-driven optical device can be displaceable across a distance of less than approximately 500 μm, and thus each lens element in a MEMS-driven varifocal lens assembly can be displaceable relative to a counterpart lens element across a distance (e.g., measured relative to lens element centers) of less than approximately 1 mm. Additionally, in some exemplary embodiments, the diameters of the lens elements can be between 300 μm-5 mm, and a separation distance between a first or initial MEMS-driven varifocal lens and a second, final, or terminal MEMS-driven varifocal lens within a MEMS-based zoom lens system can be less than 30 mm. Such a separation distance can be measured relative to a midpoint of each lens; or between an outer surface of the first lens at which optical signals are incident upon the MEMS-based zoom lens system and an outer surface of the second lens from which optical signals exit the MEMS-based zoom lens system.

As indicated above, embodiments of zoom lens systems in accordance with the present application are applicable to and advantageous for a many types of electronic devices, particularly because such zoom lens systems can be very small (i.e., miniature), highly compact, lightweight, and robust. Moreover, the performance of MEMS-driven varifocal lenses in accordance with embodiments of the present application is unaffected by gravity and/or pressure as the lens system does not comprise any liquid tunable lens or any liquid crystal systems. This is of note as applications of zoom lens systems may be subjected to use at different locations, heights or depths, and orientations. Hence, a zoom lens system in accordance with an embodiment of the present application can reliably provide consistent or constant zoom lens performance or functionality regardless or substantially regardless of an orientation, location, height, depth, and/or external environment in which the zoom lens is disposed or used. In addition, the MEMS-based lens system can be relatively shock-proof. Furthermore, focal length tuning, zooming, and focusing of MEMS lens systems in accordance with embodiments of the present application can be fast, for instance, occurring within or on the order of milliseconds (e.g., between a few milliseconds and a few hundred milliseconds).

Embodiments of the present application can be used in imaging and/or electronic device applications such as miniature surveillance cameras, endoscopic imaging systems, and portable or personal electronic or computing devices, such as personal digital assistants, smart phones, tablet computers, smart phone/tablet computer hybrids, laptop computers, desktop computers, computer monitors, televisions, and webcams.

Relative to smart phone applications, the mainstream design tendency of smart phones is an ultra-slim design with a thickness of typically less than 10 mm. In situations in which the total length of a miniature zoom lens system in accordance with an embodiment of the present application along the optical axis is larger than the thickness of the smart phone, it is necessary to fold the optical axis (902) of the lens from normal to the front/rear surface of the smart phone to parallel to the front/rear surface of the smart phone in order to maintain an ultra-slim design.

Figure 17:
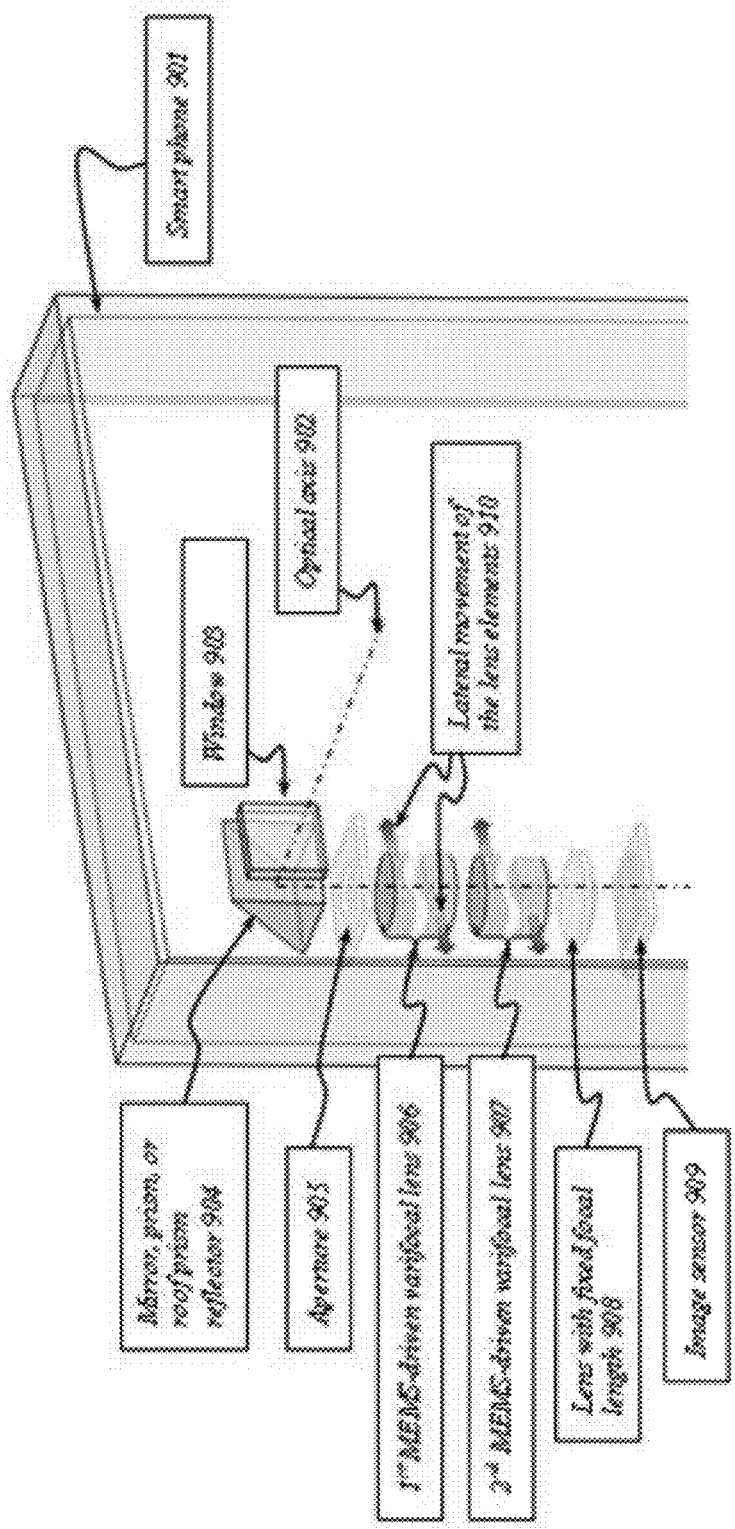
FIG. 17 is a schematic illustration of a zoom lens system in accordance with an exemplary embodiment of the present incorporated into an ultra-slim design smart phone.

FIG. 17 is a schematic illustration of a zoom lens system incorporated into an ultra-slim design smart phone in accordance with an embodiment of the present application. As shown in FIG. 17, a folded optical axis (902) can be achieved by employing a mirror, prism, or roof prism reflector (904). Light from an object enters the lens system through a window (903) on the smart phone (901) and is reflected 90 degrees by the reflector (904). After optical signals are transmitted through at least two MEMS-driven varifocal lenses (906, 907) and a set of other optical components including a set of fixed lenses (908) and a set of apertures (905), an image is captured by or produced on the image sensor (909).

In this lens system, the size of the aperture (905) can be adjusted to control the size of the ray bundles entering the lens. The optical zooming is realized through combined tuning of both focal lengths of the two MEMS-driven varifocal lenses (906, 907), while autofocus is accomplished by adjusting the $1^{st}$ MEMS-driven varifocal lens (906) alone. Both MEMS-driven varifocal lenses (906, 907) achieve focal length tuning through relative lateral movements (910) of constituent lens elements transverse or perpendicular to the optical axis (902). The lateral movements are induced by the MEMS actuators that are shown in FIG. 17.

As previously described, lenses with fixed focal lengths (908) can provide additional optical power and/or reduce optical aberrations. Additionally or alternatively, one or more of the MEMS-driven varifocal lenses (906, 907) can include structural and/or material property modifications to facilitate aberration correction, such as by way of a set of surface or thickness profile modification functions $f_i(x,y)$ mapped onto or incorporated into varifocal lens element surfaces. Further, in some embodiments, the $2^{nd}$ MEMS-driven varifocal lens (907) and the image sensor (909) are provided with a lateral motion control system, to allow relative movement with respect to each other along the optical axis. In other embodiments, the $2^{nd}$ MEMS-driven varifocal lens (907), the lens with the fixed focal length (908) and the image sensor (909) are provided with a lateral motion control system, to allow relative movement with respect to each other along the optical axis.

Figure 18:
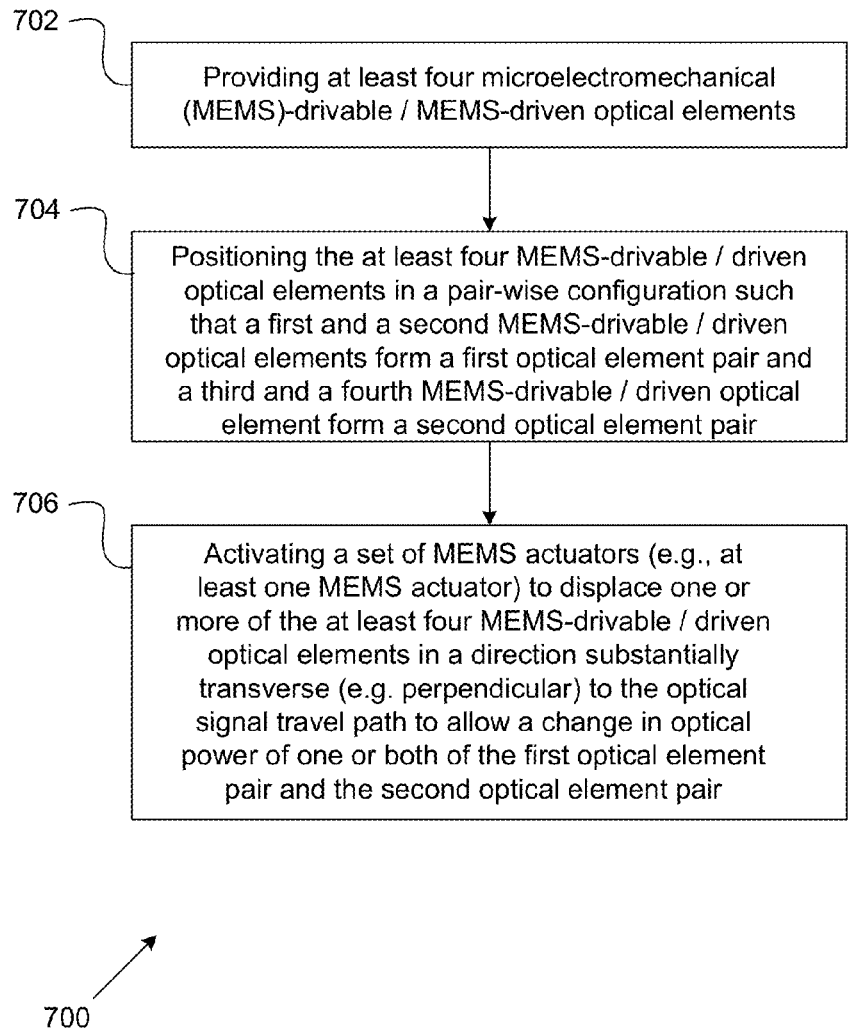
FIG. 18 is a flowchart or flow diagram of a method according to an aspect of the present application.

FIG. 18 is a flowchart or flow diagram of a process 700 for providing optical zoom according to an aspect of the present application. In a first process portion 702, at least four MEMS-driven optical elements are provided, each of the at least four MEMS-driven optical elements configured for passage of optical signals therethrough along an optical signal travel path, each of the at least four MEMS-driven optical elements including at least one free-form surface. In a second process portion 704, at least four MEMS-driven optical elements are positioned in a pair-wise configuration such that a first and a second MEMS-driven optical element form a first pair of optical elements and a third and a fourth MEMS-driven optical element form a second pair of optical elements. In a third process portion 706, at least one MEMS actuator is activated to displace one or more of the at least four MEMS-driven optical elements in a direction substantially transverse to the optical signal travel path to allow a change in optical power of one or both of the first and second pair of optical elements.

Figure 19:
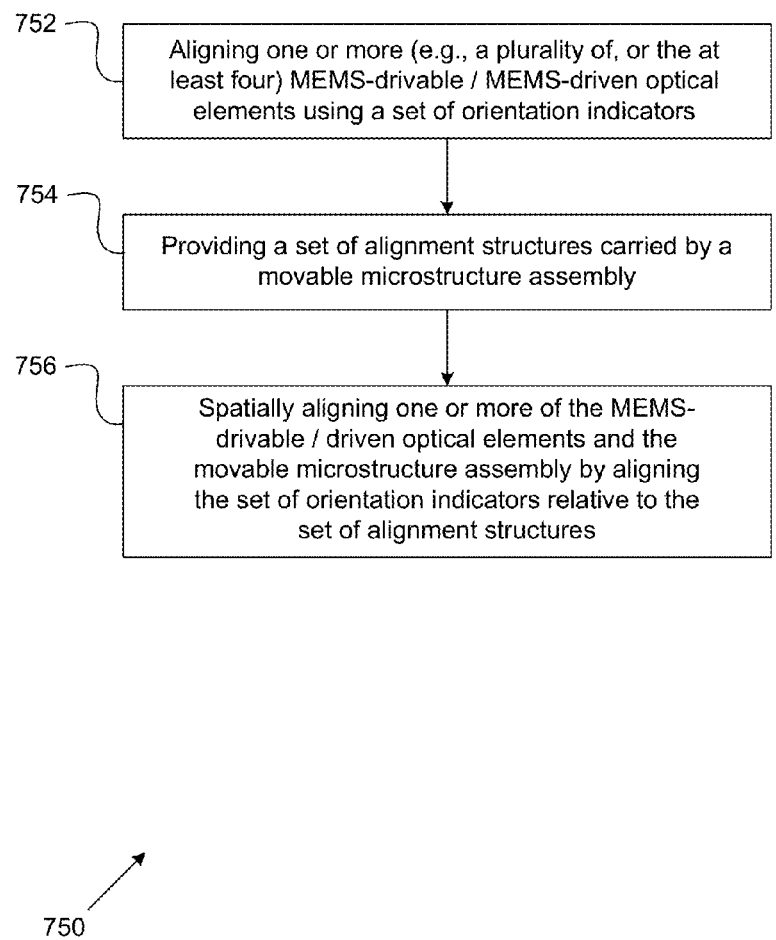
FIG. 19 is a flowchart or flow diagram of a method according to an embodiment of the present application.

FIG. 19 is a flowchart or flow diagram of an optical element alignment process 750 according to an embodiment of the present application, where process portions described in relation to FIG. 19 can accompany process portions described above in relation to FIG. 18. In a first process portion 752, the at least four MEMS-driven optical elements are aligned using a set of orientation indicators, wherein the set of orientation indicators correspond to at least one reference axis of one or more freeform surfaces of one or more of the MEMS-driven optical elements, and the at least one reference axis is transverse to a thickness profile variation axis of the freeform surface. In a second process portion 754, a set of alignment structures carried by a movable microstructure assembly is provided. In a third process portion 756, the one or more of the MEMS-driven optical elements and the movable microstructure assembly are spatially aligned by aligning the set of orientation indicators relative to the set of alignment structures.

Figure 20:
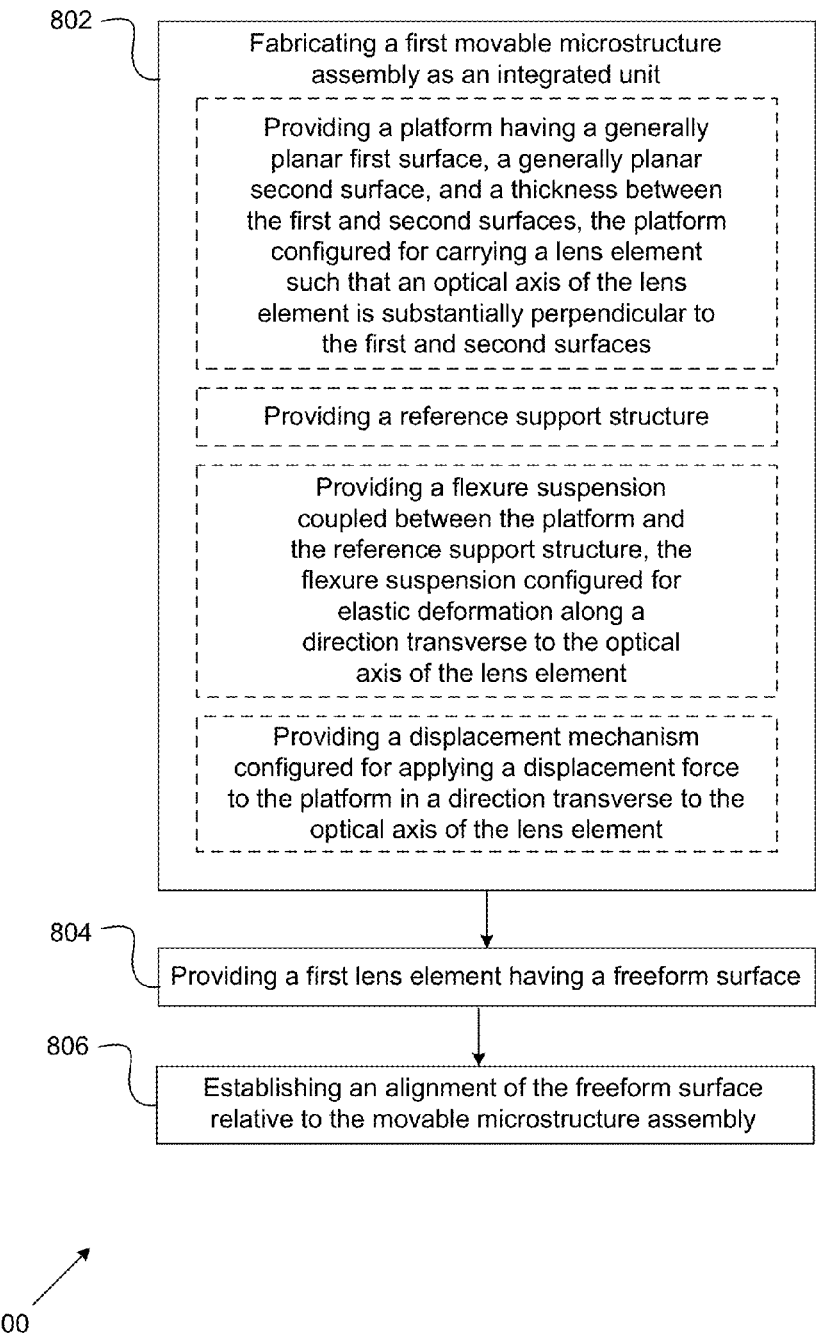
FIG. 20 is a flowchart or flow diagram of a method for manufacturing according to another aspect of the present application.

FIG. 20 is a flowchart or flow diagram of a process 800 for manufacturing a MEMS-based zoom lens system according to an embodiment of the present application. In a first process portion 802, a first movable microstructure assembly is provided or fabricated as an integrated unit. In particular embodiments, the first process portion 802 involves providing a platform having a generally planar first surface, a generally planar second surface, and a thickness between the first surface and the second surface, where the platform is configured for carrying a lens element such that an optical axis of the lens element is substantially perpendicular to the first and second surfaces. Further, the assembly includes a reference support structure, and a flexure suspension coupled between the platform and the reference support structure. The flexure suspension is configured for elastic deformation along a direction transverse (e.g., substantially perpendicular) to the optical axis of the lens element. The assembly includes a displacement mechanism configured to apply a displacement force to the platform in a direction transverse (e.g., substantially perpendicular) to the optical axis of the lens element.

In a second process portion 804, a first lens element having a freeform surface is provided; and in a third process portion 806, an alignment of the freeform surface relative to the movable microstructure assembly is established.

Aspects of particular embodiments of the present application address at least one aspect, problem, limitation, and/or disadvantage associated with exiting zoom lens systems, apparatuses, devices, elements, or structures. While features, aspects, and/or advantages associated with certain embodiments have been described in the application, other embodiments may also exhibit such features, aspects, and/or advantages, and not all embodiments need necessarily exhibit such features, aspects, and/or advantages to fall within the scope of the application. It will be appreciated by a person of ordinary skill in the art that several of the above-disclosed systems, components, processes, or alternatives thereof, may be desirably combined into other different systems, components, processes, and/or applications. In addition, various modifications, alterations, and/or improvements may be made to various embodiments that are disclosed by a person of ordinary skill in the art within the scope and spirit of the present application. For example, it is understood that various operations that are described in by the disclosed processes may be conducted in a different sequential order, and further, additional or fewer steps may be used to carry out the various disclosed operations. Such modifications, alterations, and/or improvements are encompassed by the following claims.

The invention claimed is:

1. A zoom lens system comprising:
a plurality of microactuators, each configured to displace at least one optical element;
at least four optical elements, each of the at least four optical elements configured for passage of optical signals therethrough along an optical signal travel path, each of the at least four optical elements including at least one free-form surface,
the at least four optical elements positioned in a pair-wise configuration such that a first and a second optical element comprise a first pair having a variable focal length and a third and a fourth optical element comprise a second pair having a variable focal length, each of the at least four optical elements displaceable by operation of the plurality of microactuators in a direction substantially transverse to the optical signal travel path to cause a change in optical power of the system.

2. The zoom lens system of claim 1, wherein the at least four optical elements are configured to provide an optical magnification of at least approximately 2×.

3. The zoom lens system of claim 1, wherein the at least four optical elements comprise an initial lens element and a final lens element separated by a distance of less than approximately 30 mm.

4. The zoom lens system of claim 1, wherein the at least four optical elements are configured to provide the zoom lens system with each of an optical zoom and autofocus functionality.

5. The zoom lens system of claim 4, wherein the first pair of optical elements comprises a first varifocal lens that is configured to operate as one of either an Alvarez lens or a Lohmann lens.

6. The zoom lens system of claim 5, wherein the second pair of optical elements comprises a second varifocal lens that is configured to operate as one of either an Alvarez lens or a Lohmann lens.

7. The zoom lens system of claim 6, wherein an optical zoom functionality is realized through combined tuning of the variable focal length of the first varifocal lens and the variable focal length of the second varifocal lens.

8. The zoom lens system of claim 6, wherein an autofocus functionality is realized through adjustment of the variable focal length of the first varifocal lens independent of the second varifocal lens.

9. The zoom lens system of claim 4, wherein one or both of the first and the second pairs of optical elements comprise a varifocal lens that is configured to operate as one of either an Alvarez lens or a Lohmann lens.

10. The zoom lens system of claim 4, wherein one or both of the first and the second pairs of optical elements comprise a varifocal lens comprising surfaces that are correlated in accordance with a higher-than-third-order polynomial.

11. The zoom lens system of claim 1, further comprising a plurality of MEMS flexure suspensions, each MEMS flexure suspension coupled to a MEMS-driven optical element of the at least four MEMS-driven optical elements, each MEMS flexure suspension configured for elastic deformation in a direction substantially transverse to the optical signal travel path.

12. The zoom lens system of claim 1, further comprising a first displacement apparatus configured for displacement of the first optical element relative to the second optical element in a direction substantially transverse to the optical signal travel path, the first displacement apparatus comprising:
at least one reference support structure;
a first platform configured to carry the first optical element;
a first flexure suspension coupled between the first platform and the at least one reference support structure;
a second platform configured to carry the second optical element; and
a second flexure suspension coupled between the second platform and the at least one reference support structure,
wherein each of the first flexure suspension and the second flexure suspension is configured for elastic deformation along a direction substantially transverse to the optical signal travel path.

13. The zoom lens system of claim 12, wherein the first displacement apparatus further comprises a set of drive mechanisms configured to apply a displacement force to each of the first platform and the second platform, the set of drive mechanisms including at least one of the plurality of microactuators.

14. The zoom lens system of claim 13, wherein the set of drive mechanisms comprises at least one of the plurality of microactuators coupled to at least one displacement amplification mechanism, the displacement amplification mechanism configured to displace the first platform relative to the second platform in a direction substantially transverse to the optical signal travel path.

15. The zoom lens system of claim 14, wherein the displacement amplification mechanism includes a first set of flexure beams coupled between a first microactuator and the first platform.

16. The zoom lens system of claim 15, wherein the displacement amplification mechanism further includes a second set of flexure beams coupled between a second microactuator and the second platform.

17. The zoom lens system of claim 1, further comprising a variable aperture configured to limit an amount of light traveling through the zoom lens system.

18. The zoom lens system of claim 1, further comprising a set of additional optical components for providing at least one of modifying optical power and aberration correction, the set of additional optical components including at least one of a group comprising a spherical surface, an aspherical surface, and a freeform surface.

19. The zoom lens system of claim 18, wherein the set of additional optical components are substantially fixed in position in a direction substantially transverse to the optical signal travel path but are movable along the optical signal travel path.

20. The zoom lens system of claim 1, wherein the at least four optical elements comprises a plurality of substantially freeform surfaces, the plurality of substantially freeform surfaces corresponding to one of a group of an initially defined Alvarez lens and an initially defined Lohmann lens, to which an aberration correction function f(x,y) is applied.

21. The zoom lens system of claim 20, wherein the aberration correction function f(x,y) is based on modifications to an optical element thickness profile.

22. The zoom lens system of claim 1, wherein one or more of the at least four optical elements includes a set of orientation indicators to allow alignment of one or more of the at least four optical elements within the zoom lens system.

23. A method for providing an optical zoom, comprising:
providing at least four optical elements, each of the at least four optical elements configured for passage of optical signals therethrough along an optical signal travel path, each of the at least four optical elements including at least one free-form surface; and
positioning the at least four optical elements in a pair-wise configuration such that a first and a second optical element form a first pair of optical elements having a variable focal length and a third and a fourth optical element form a second pair of optical elements having a variable focal length, wherein
activating a plurality of microactuators displaces at least two of the at least four optical elements in a direction substantially transverse to the optical signal travel path to cause a change in optical power of the combination of the first and second pair of optical elements.

24. The method of claim 23, wherein the first pair of optical elements comprise a first varifocal lens and the second pair of optical elements comprises a second varifocal lens, and displacing the first lens element relative to the second lens element changes the variable focal length of the first varifocal lens.

25. The method of claim 24, further comprising providing an autofocus functionality by changing the variable focal length of the first pair while holding the variable focal length of the second pair constant.

26. The method of claim 24, comprising providing an optical zoom functionality through combined tuning of the variable focal length of the first varifocal lens and the variable focal length of the second varifocal lens.

27. The method of claim 23, further comprising amplifying actuation of at least one of the plurality of microactuators with a displacement amplification mechanism.

28. The method of claim 23, further placing an additional optical element in the optical signal travel path to reduce optical aberrations or modify optical power.

29. The method of claim 23, further comprising limiting an amount of light traveling through the zoom lens system using a variable aperture.

30. The method of claim 23, further comprising aligning the at least four optical elements using a set of orientation indicators, wherein the set of orientation indicators correspond to at least one reference axis of the freeform surface of one or more of the optical elements, the at least one reference axis is transverse to a thickness profile variation axis of the freeform surface, and the aligning comprises:
providing a set of alignment structures carried by a movable microstructure assembly, and
spatially aligning one or more of the optical elements and the movable microstructure assembly by aligning the set of orientation indicators relative to the set of alignment structures.

31. A method for manufacturing a zoom lens system comprising:
fabricating at least two movable microstructure assemblies as integrated units, the movable microstructure assemblies comprising:
a platform having a generally planar first surface, a generally planar second surface, and a thickness between the first surface and the second surface, the platform configured for carrying a lens element such that an optical axis of the lens element is substantially perpendicular to the first and second surfaces;
a reference support structure;
a flexure suspension coupled between the platform and the reference support structure, the flexure suspension configured for elastic deformation along a direction transverse to the optical axis of the lens element; and
a displacement mechanism configured to apply a displacement force to the platform in a direction transverse to the optical axis of the lens element;
providing, for each assembly, a first lens element having a freeform surface; and
establishing an alignment of the freeform surfaces relative to the movable microstructure assembly.

32. The method of claim 31, wherein the displacement mechanism comprises a microactuator.

33. The method of claim 31, wherein the displacement mechanism comprises a microactuator coupled to a displacement amplification mechanism.

34. The method of claim 31, wherein the movable microstructure assemblies are fabricated by way of an SOI micromachining process.

35. The method of claim 31, wherein each of the movable microstructure assemblies and the associated first lens element are collectively assembled as an integrated unit.

36. The method of claim 31, wherein the first lens element includes a set of orientation indicators corresponding to at least one reference axis of the freeform surface, the at least one reference axis transverse to a thickness profile variation axis of the freeform surface, the method further comprising:
providing a set of alignment structures carried by the movable microstructure assembly; and
spatially aligning the first lens element and the movable microstructure assembly by aligning the set of orientation indicators relative to the set of alignment structures.

37. The method of claim 36, wherein the set of alignment structures includes a diffraction grating.

38. The method of claim 31, further comprising assembling a set of varifocal lenses by pairing a first of the movable microstructure assemblies with the aligned first lens element having a freeform surface with a second of the movable microstructure assemblies with an aligned second lens element having a freeform surface.

39. The method of claim 38, wherein the freeform surface of the first lens element corresponds to the freeform surface of the second lens element.

40. The method of claim 31, further comprising fabricating a lens element having a freeform surface with a replication molding process.

41. The method of claim 40, wherein the replication molding process comprises using a master mold with the desired freeform surface fabricated through single-point diamond turning.

42. The method of claim 40, wherein the lens element is comprised of an ultra-violet light curable optical adhesive.

43. An electronic imaging device comprising:
an optical window having a cross sectional area transverse to an optical axis and configured to allow propagation of optical signals to the electronic device along the optical axis;
a miniaturized zoom lens system configured to receive optical signals propagating through the optical window along the optical axis, the zoom lens system comprising at least four optical elements, each of the at least four optical elements including at least one free-form surface, the at least four optical elements positioned in a pair-wise configuration such that a first and a second optical element form a first pair having a variable focal length and a third and a fourth optical element form a second pair having a variable focal length, each of the at least four optical elements displaceable by at least one of a plurality of microactuators in a direction substantially transverse to the optical signal travel path to allow a change in optical power of one or both of the first and second pairs; and an image sensor configured to receive optical signals propagating through the zoom lens system along the optical axis.

44. The electronic imaging device of claim 43, wherein the electronic device is any one of a personal digital assistant, a mobile telephone, a tablet computer, a mobile telephone-tablet computer hybrid device, a laptop computer, a desktop computer, a computer monitor, a television, a webcam, a miniature surveillance camera, and an endoscope.

45. The electronic imaging device of claim 43, wherein the optical axis comprises a first optical axis segment and a second optical axis segment, the second optical axis segment being non-parallel to the first optical axis segment.

46. The electronic imaging device of claim 45, wherein the first optical axis segment and the second optical axis segment are substantially perpendicular to each other.

47. The electronic imaging device of claim 43, wherein the functionality of the miniaturized zoom lens system is substantially unaffected by any of gravitational force, atmospheric pressure, and physical movement of the zoom lens system.

48. The electronic imaging device of claim 43, wherein at least one of the first and second pairs, and the imaging sensor, are configured to allow relative motion with respect to each other along the optical axis.

* * * * *